United States Patent
Kamata

(10) Patent No.: US 8,976,571 B2
(45) Date of Patent: Mar. 10, 2015

(54) METHOD FOR DRIVING SEMICONDUCTOR DEVICE

(75) Inventor: Koichiro Kamata, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 127 days.

(21) Appl. No.: 13/274,649

(22) Filed: Oct. 17, 2011

(65) Prior Publication Data

US 2012/0099368 A1 Apr. 26, 2012

(30) Foreign Application Priority Data

Oct. 20, 2010 (JP) .................................. 2010-235159
May 20, 2011 (JP) .................................. 2011-113231

(51) Int. Cl.
*G11C 11/24* (2006.01)
*G11C 11/4094* (2006.01)
*G11C 11/4076* (2006.01)
*G11C 11/56* (2006.01)
*H01L 27/108* (2006.01)
*H01L 27/12* (2006.01)

(52) U.S. Cl.
CPC ........ *G11C 11/4094* (2013.01); *G11C 11/4076* (2013.01); *G11C 11/565* (2013.01); *H01L 27/10873* (2013.01); *H01L 27/1203* (2013.01)
USPC ...................... 365/149; 365/189.16

(58) Field of Classification Search
USPC ............................................ 365/149, 189.16
See application file for complete search history.

(56) References Cited

U.S. PATENT DOCUMENTS

| | | | | |
|---|---|---|---|---|
| 4,661,929 A | * | 4/1987 | Aoki et al. | 365/149 |
| 4,701,884 A | | 10/1987 | Aoki et al. | |
| 5,771,187 A | * | 6/1998 | Kapoor | 365/149 |
| 5,978,255 A | * | 11/1999 | Naritake | 365/149 |
| 5,995,403 A | | 11/1999 | Naritake | |
| 6,178,121 B1 | * | 1/2001 | Maruyama | 365/189.09 |
| 6,577,530 B2 | | 6/2003 | Muranaka et al. | |
| 6,727,522 B1 | | 4/2004 | Kawasaki et al. | |
| 6,795,331 B2 | * | 9/2004 | Noro | 365/145 |
| 7,064,346 B2 | | 6/2006 | Kawasaki et al. | |
| 2001/0012215 A1 | * | 8/2001 | Furukawa et al. | 365/149 |

(Continued)

FOREIGN PATENT DOCUMENTS

| | | |
|---|---|---|
| EP | 1 134 811 A1 | 9/2001 |
| EP | 1 746 659 A2 | 1/2007 |

(Continued)

OTHER PUBLICATIONS

International Search Report, PCT Application No. PCT/JP2011/073151, dated Jan. 17, 2012, 3 pages.

(Continued)

*Primary Examiner* — Douglas King
(74) *Attorney, Agent, or Firm* — Fish & Richardson P.C.

(57) ABSTRACT

It is an object to obtain a memory element (DRAM) storing multilevel data easily. The amount of charge accumulated in a capacitor of a memory element (DRAM) is controlled by changing the potential of a wiring (a bit line), which is used for writing data to the memory element (DRAM), in a period in which a transistor included in the memory element (DRAM) is on. Thus, multilevel data stored in the memory element (DRAM) can be obtained without a complex configuration of a semiconductor device including the memory element (DRAM).

12 Claims, 32 Drawing Sheets

(56) References Cited

U.S. PATENT DOCUMENTS

| | | |
|---|---|---|
| 2002/0096702 A1 | 7/2002 | Ishii et al. |
| 2003/0174533 A1* | 9/2003 | Ito .................................. 365/149 |
| 2003/0218222 A1 | 11/2003 | Wager, III et al. |
| 2009/0207648 A1* | 8/2009 | Song ............................. 365/149 |
| 2011/0089419 A1 | 4/2011 | Yamazaki et al. |

FOREIGN PATENT DOCUMENTS

| | | |
|---|---|---|
| JP | 62-040690 A | 2/1987 |
| JP | 62-095796 A | 5/1987 |
| JP | 09-180465 A | 7/1997 |
| JP | 09-237495 A | 9/1997 |
| JP | 09-320280 A | 12/1997 |
| JP | 2000-150900 A | 5/2000 |
| JP | 2002-094029 A | 3/2002 |
| JP | 2002-133876 A | 5/2002 |
| KR | 1990-0002664 B | 4/1990 |
| KR | 2002-0021310 A | 3/2002 |
| WO | 00/30183 A1 | 5/2000 |

OTHER PUBLICATIONS

Written Opinion, PCT Application No. PCT/JP2011/073151, dated Jan. 17, 2012, 5 pages.

* cited by examiner

● In
◐ Sn
◌ Zn
• O

METHOD FOR DRIVING SEMICONDUCTOR DEVICE

TECHNICAL FIELD

The present invention relates to a method for driving memory elements. In particular, the present invention relates to a method for driving a memory element which can store multilevel data. Further, the present invention relates to a method for driving a semiconductor device including the memory element.

BACKGROUND ART

Memory devices using semiconductor elements are broadly classified into two categories: a volatile device that loses stored data when power supply stops, and a non-volatile device that retains stored data even when power is not supplied.

A typical example of a volatile memory device is a static random access memory (SRAM). Since an SRAM holds stored data with a circuit such as a flip flop, the number of elements per memory element is increased (for example, six transistors per memory element); therefore, cost per storage capacity is increased.

Another example of a volatile memory device is a dynamic random access memory (DRAM). A DRAM stores data in such a manner that a transistor included in a memory cell is selected and charge is accumulated in a capacitor. In general, a DRAM is used as an element which stores one bit (two values) of data. However, a DRAM can be used as an element which stores two or more bits (four or more values) of data when there are four or more levels of the amount of charge accumulated in a capacitor of the DRAM (e.g., see Patent Document 1).

REFERENCE

[Patent Document 1] Japanese Published Patent Application No. H9-320280.

DISCLOSURE OF INVENTION

A semiconductor memory device disclosed in Patent Document 1 has a problem of a complex configuration such as layered bit lines for writing or reading multilevel data to/from a memory cell. In view of the above problem, an object of an embodiment of the present invention is to obtain a memory element storing multilevel data easily.

It is an object of an embodiment of the present invention to control the amount of charge accumulated in a capacitor of a memory element by changing the potential of a wiring (a bit line), which is used for writing data to the memory element, in a period in which a transistor included in the memory element is on.

Specifically, an embodiment of the present invention is a method for driving a memory element that includes a word line, a bit line, a transistor, and a capacitor. The transistor includes a gate electrically connected to the word line, and a source and a drain one of which is electrically connected to the bit line. The capacitor includes an electrode electrically connected to the other of the source and the drain of the transistor; and the other electrode electrically connected to a wiring supplying a fixed potential. The potential of the bit line is changed in a period in which a potential to turn the transistor on is supplied to the word line so that the amount of charge, that is stored in a node where the other of the source and the drain of the transistor and the one electrode of the capacitor are electrically connected to each other, is controlled.

In a method for driving a memory element according to an embodiment of the present invention, the potential applied to a bit line is changed so as to obtain multilevel data stored in the memory element. Therefore, multilevel data stored in the memory element can be obtained without a complex configuration of a semiconductor device including the memory element.

BEST MODE FOR CARRYING OUT THE INVENTION

Hereinafter, embodiments of the present invention will be described in detail with reference to the accompanying drawings. Note that the present invention is not limited to the following description, and it is easily understood by those skilled in the art that a variety of changes and modifications can be made without departing from the spirit and scope of the present invention. Therefore, the present invention should not be limited to the descriptions of the embodiments and the embodiment below.

<Example of Method for Driving Memory Element>

Figure 1A:
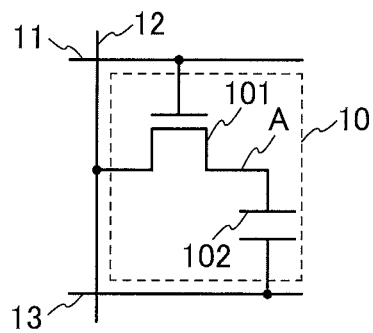
FIG. 1A illustrates a configuration example of a memory element and FIGS. 1B to 1E each illustrate an example of a driving method thereof.

First, an operation of writing data to a memory element 10 will be described with reference to FIGS. 1A to 1E. FIG. 1A illustrates a configuration example of a memory element according to an embodiment of the present invention.

The memory element 10 in FIG. 1A includes a transistor 101 and a capacitor 102. A gate of the transistor 101 is electrically connected to a word line 11 and one of a source and a drain of the transistor 101 is electrically connected to a bit line 12. One of electrodes of the capacitor 102 is electrically connected to the other of the source and the drain of the transistor 101 and the other electrode of the capacitor 102 is electrically connected to a wiring 13 supplying a fixed potential.

Note that the fixed potential can be any potential. For example, a ground potential or 0 V can be used as the fixed potential. Here, the transistor 101 is an n-channel transistor. A node where the other of the source and the drain of the transistor 101 and the one electrode of the capacitor 102 are electrically connected to each other is referred to as a node A. A method for driving the memory element 10 will be described below.

FIGS. 1B to 1E illustrate change in the potential of the word line 11, the potential of the bit line 12, and the potential of the node A. The potentials are changed when data is written to the memory element 10. Note that each of FIGS. 1B to 1E illustrates an example of a driving method in the case of writing different data to the memory element 10 (in the case of writing different potentials to the node A).

Figure 1B:
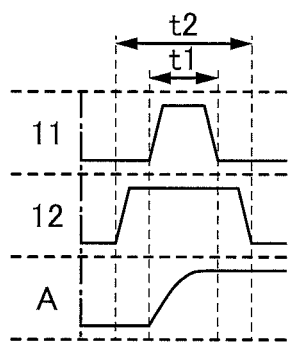

In the driving method in FIG. 1B, a period t2 in which the potential of the bit line 12 is at a high level includes a period t1 in which the potential of the word line 11 is at the high level. Therefore, in the driving method in FIG. 1B, a positive charge is supplied to the node A during the period t1. Thus, after the period t1 passes, the potential of the node A is higher than the potentials of the node A shown in FIGS. 1C to 1E, which are described later.

Figure 1C:
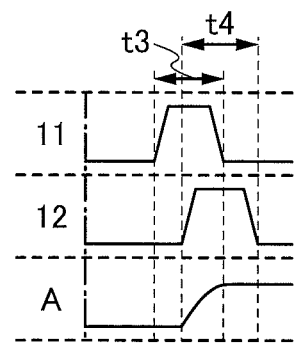

In the driving method in FIG. 1C, a period t4 in which the potential of the bit line 12 is at the high level overlaps with the latter part of a period t3 in which the potential of the word line 11 is at the high level. Therefore, in the driving method in FIG. 1C, a positive charge is supplied to the node A only in the latter part of the period t3. Thus, after the period t3 passes, the potential of the node A is lower than the above-described potential of the node A shown in FIG. 1B and higher than the potentials of the node A shown in FIGS. 1D and 1E, which are described later.

Figure 1D:
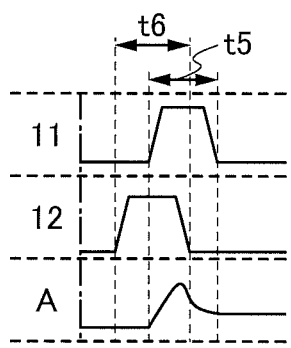

In the driving method in FIG. 1D, a period t6 in which the potential of the bit line 12 is at the high level overlaps with the former part of a period t5 in which the potential of the word line 11 is at the high level. Therefore, in the driving method in FIG. 1D, a positive charge is supplied to the node A in the former part of the period t5 and discharged in the latter part thereof. Thus, after the period t5 passes, the potential of the node A is lower than the above-described potentials of the node A shown in FIGS. 1B and 1C and higher than the potential of the node A shown in FIG. 1E, which is described later.

Figure 1E:
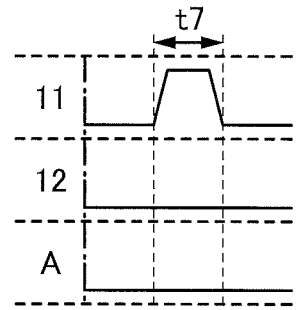

In the driving method in FIG. 1E, the potential of the bit line 12 keeps being at a low level during a period t7 in which the potential of the word line 11 is at the high level. Thus, after the period t7 passes, the potential of the node A is lower than the potentials of the node A in FIGS. 1B to 1D.

As described above, in the method for driving the memory element 10 disclosed in this specification, the potential of the bit line 12 is kept at the predetermined potential (a high-level or low-level potential) during a period (a period in which the transistor 101 is on) in which the potential of the word line 11 is at the high level or the potential of the bit line 12 is changed in the period, such that the potential of the node A of the memory element is set at a desired value. Thus, the potential of the node A (the amount of charge stored in the node A) can be easily set at a plurality of levels; that is, the memory element storing multilevel data can be obtained easily.

Note that FIGS. 1B to 1E illustrate the case where the potential of the node A is set at four levels (the memory element 10 stores two bits of data); however, the potential of the node A can be set at five levels by controlling the potential of the bit line 12 as appropriate.

Figure 2A:
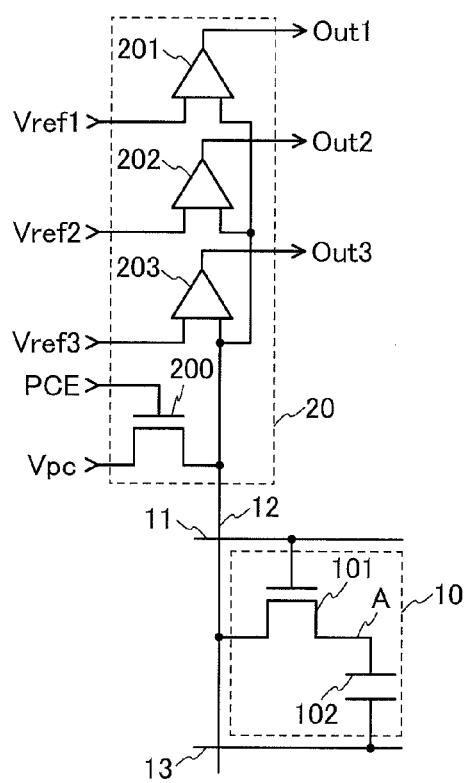
FIG. 2A illustrates a configuration example of a reading circuit and FIGS. 2B to 2E each illustrate an example of a driving method thereof.

Next, an operation of reading data from the memory element 10 will be described with reference to FIGS. 2A to 2E. FIG. 2A illustrates a configuration example of a reading circuit 20 for reading data from the memory element 10 in FIG. 1A.

The reading circuit 20 in FIG. 2A includes a transistor 200, a comparator 201, a comparator 202, and a comparator 203. A gate of the transistor 200 is electrically connected to a wiring supplying a precharge signal (PCE), one of a source and a drain of the transistor 200 is electrically connected to a wiring supplying a precharge voltage (Vpc), and the other of the source and the drain of the transistor 200 is electrically connected to the bit line 12. A first input terminal of the comparator 201 is electrically connected to a wiring supplying a first reference voltage (Vref1) and a second input terminal of the comparator 201 is electrically connected to the bit line 12. A first input terminal of the comparator 202 is electrically connected to a wiring supplying a second reference voltage (Vref2) and a second input terminal of the comparator 202 is electrically connected to the bit line 12. A first input terminal of the comparator 203 is electrically connected to a wiring supplying a third reference voltage (Vref3) and a second input terminal of the comparator 203 is electrically connected to the bit line 12.

Note that here, the precharge voltage (Vpc) is an intermediate potential between a high-level potential and a low-level potential (1.5 V in the case where the high-level potential is 3 V and the low-level potential is 0 V), which are supplied to the bit line 12. Further, the first reference voltage (Vref1) is lower than the precharge voltage (Vpc), the second reference voltage (Vref2) is equal to the precharge voltage (Vpc), and the third reference voltage (Vref3) is higher than the precharge voltage (Vpc). Accordingly, with the reading circuit 20, an output signal (Out1) of the comparator 201, an output signal (Out2) of the comparator 202, and an output signal (Out3) of the comparator 203 are distinguished, so that data stored in the memory element 10 can be read. A specific example of a reading operation will be described below.

FIGS. 2B to 2E each illustrate the potential of the precharge signal (PCE), the potential of the node A, the potential of the word line 11, and the potential of the bit line 12 in the case where data is read from the memory element 10. Note that FIGS. 2B to 2E illustrate examples of a driving method in which data (the potential of the node A) written to the memory element 10 by corresponding operations in FIGS. 1B to 1E is read. In operations in FIGS. 2B to 2E, the potential of the bit line 12 is set at the precharge voltage (Vpc) in a period (T1, T3, T5, or T7) in which the potential of the precharge signal (PCE) is at the high level. After that, in a period (T2, T4, T6, or T8) in which the potential of the word line 11 is at the high level, the bit line 12 transmits or receives charge to/from the node A. In this manner, the potential of the bit line 12 can be changed in accordance with data (the potential of the node A) stored in the memory element 10. In addition, the potential of the bit line 12 is distinguished by the comparators 201 to 203, so that data stored in the memory element 10 is read.

Figure 2B:
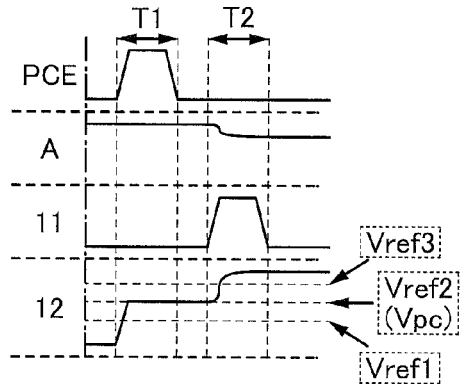
Figure 2C:
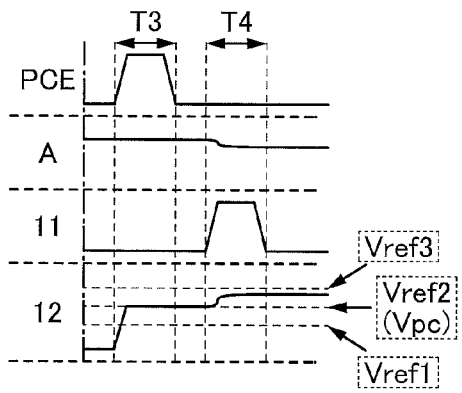
Figure 2D:
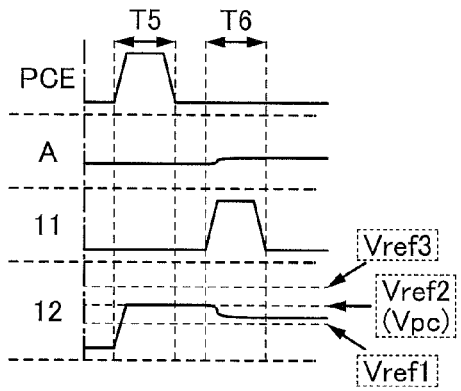
Figure 2E:
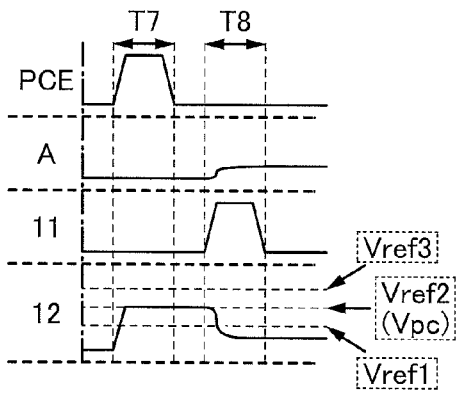

Note that FIG. 2B illustrates an operation in which data stored in the memory element 10 by the driving method in FIG. 1B is read. FIG. 2C illustrates an operation in which data stored in the memory element 10 is read by the driving method in FIG. 1C. FIG. 2D illustrates an operation in which data stored in the memory element 10 is read by the driving method in FIG. 1D. FIG. 2E illustrates an operation in which data stored in the memory element 10 is read by the driving method in FIG. 1E.

<Specific Example of Semiconductor Device>

A semiconductor device including the memory element 10 disclosed in this specification includes many transistors (e.g., the transistor 101 of the memory element 10 and a transistor of a driver circuit, including the reading circuit 20, for driving the memory element 10). Note that the characteristics required for these transistors are different from each other. Specifically, in the memory element 10 disclosed in this specification, multilevel data can be obtained by control of the amount of charge stored in the node A. Therefore, change in the amount of charge in a period for storing the data is preferably prevented. In short, it is preferable that the transistor 101 of the memory element 10 be a transistor having low off-state current. Thus, data stored in the memory element 10 can be more accurate and a refresh interval can be lengthened. On the other hand, it is preferable that the transistor of a driver circuit, including the reading circuit 20, for driving the memory element 10 be a transistor which can operate at high speed. In short, it is preferable that the transistor of the driver circuit be a transistor having high mobility.

For example, it is preferable that a transistor whose channel region is formed using an oxide semiconductor be used as the former transistor and a transistor whose channel region is formed using polycrystalline silicon or single crystal silicon be used as the latter transistor; in this manner, the above need is met. Specifically, the semiconductor device can be fabricated by the following manner, for example: a transistor formed using a single crystal silicon substrate is used as a transistor of a driver circuit, and a transistor, whose channel region is formed using an oxide semiconductor, formed using the single crystal silicon substrate by a photolithography method or the like is used as a transistor of the memory element 10; alternatively, a transistor, whose channel region formed using an oxide semiconductor, formed using a substrate having an insulation surface (e.g., a glass substrate) is used as a transistor of the memory element 10, and a transistor, whose channel region is formed using polycrystalline silicon or single crystal silicon, is used as a transistor of the driver circuit.

Note that it is not necessary that all transistors of the driver circuit are transistors having high mobility such as a transistor including polycrystalline silicon or single crystal silicon. For example, a transistor whose channel region is formed using an oxide semiconductor can be used as the transistor 200 in FIG. 2A.

The oxide semiconductor has a band gap wider than silicon and an intrinsic carrier density lower than silicon. By using such an oxide semiconductor for the channel region of the transistor, the transistor with an extremely low off-state current (leakage current) can be realized.

In addition, the oxide semiconductor is preferably an i-type (intrinsic) or substantially intrinsic oxide semiconductor (purified OS) in which the concentration of impurities such as moisture or hydrogen that might serve as electron donors (donors) has been reduced. Therefore, the off-state current (leakage current) of the transistor whose channel region is formed using an oxide semiconductor can be further reduced. Specifically, the oxide semiconductor has a hydrogen concentration of $5\times10^{19}$ (atoms/cm$^3$) or less, preferably $5\times10^{18}$ (atoms/cm$^3$) or less, further preferably $5\times10^{17}$ (atoms/cm$^3$) or less when the hydrogen concentration is measured by secondary ion mass spectrometry (SIMS). The carrier density of the oxide semiconductor measured by Hall effect measurement is less than $1\times10^{14}$/cm$^3$, preferably less than $1\times10^{12}$/cm$^3$, further preferably less than $1\times10^{11}$/cm$^3$. Furthermore, the band gap of the oxide semiconductor is 2 eV or more, preferably 2.5 eV or more, more preferably 3 eV or more.

Note that analysis of the hydrogen concentration by secondary ion mass spectroscopy (SIMS) is mentioned. It is known that it is difficult to obtain data in the proximity of a surface of a sample or in the proximity of an interface between stacked films formed using different materials by the SIMS analysis in principle. Thus, in the case where distributions of the hydrogen concentrations of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, as the oxide semiconductor, it is possible to use any of the following oxides: In—Sn—Ga—Zn-based oxide, In—Hf—Ga—Zn-based oxide, In—Al—Ga—Zn-based oxide, In—Sn—Al—Zn-based oxide, In—Sn—Gf—Zn-based oxide, and In—Hf—Al—Zn-based oxide which are oxides of four metal elements; In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Gf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; indium oxide, tin oxide, and zinc oxide. Note that in this specification, for example, an In—Ga—Zn-based oxide means a metal oxide including indium (In), tin (Sn), gallium (Ga), and zinc (Zn), and there is no particular limitation on the composition ratio. The In—Ga—Zn-based oxide may contain a metal element other than the In, Ga, and Zn. The above oxide semiconductor may contain silicon.

Alternatively, a material represented by a chemical formula, $InMO_3(ZnO)_m$ (m>0 is satisfied, and m is not an integer) may be used as an oxide semiconductor. Note that M represents one or more metal elements selected from Ga, Al, Fe, Mn, and Co. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that an In—Sn—Zn-based oxide can be referred to as ITZO and can be manufactured with the use of an oxide target which has a composition ration of In:Sn:Zn=1:2:2, 2:1:3, 1:1:1, 20:45:35, or the like in an atomic ratio.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn A:B:C (A+B+C=1)" means that a, b, and c satisfy the following relation: $(a-A)^2+(b-B)^2+(c-C)^2 \le r^2$, and r may be 0.05, for example. A variable r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is fabricated with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

[FORMULA 1]

$$Ra = \frac{1}{S_0} \int_{y_1}^{y_2} \int_{x_1}^{x_2} |f(x, y) - Z_0| dx dy \qquad (A1)$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

The crystal structure of the oxide semiconductor is not limited to a particular one. In other words, the oxide semiconductor may be an oxide semiconductor having an amorphous structure, an oxide semiconductor having a crystalline structure, or an oxide semiconductor having an amorphous structure and a crystalline structure. For example, the oxide semiconductor can be an oxide semiconductor including crystal (C Axis Aligned Crystal; also referred to as CAAC) which has a hexagonal crystal structure and c-axes are substantially perpendicular to a surface over which the oxide semiconductor is formed.

<Crystal Structure of Oxide Semiconductor>

In the following description, an oxide including a crystal with c-axis alignment, which has a triangular or hexagonal atomic arrangement when seen from the direction of an a–b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a–b plane (the crystal rotates around the c-axis). Such a crystal is also referred to as a c-axis aligned crystal (CAAC).

In a broad sense, an oxide including CAAC means a non-single-crystal oxide including a phase which has a triangular, hexagonal, regular triangular, or regular hexagonal atomic arrangement when seen from the direction perpendicular to the a–b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where CAAC includes oxygen, nitrogen may be substituted for part of the oxygen. The c-axes of individual crystalline portions included in the CAAC may be aligned in one direction (e.g., a direction perpendicular to a surface of a substrate over which the CAAC is formed or a surface of the CAAC). Alternatively, the normals of the a–b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is an oxide which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, FIGS. 17A to 17C, and FIGS. 32A and 32B. In FIGS. 15A to 15E, FIGS. 16A to 16C, FIGS. 17A to 17C, and FIGS. 32A and 32B, the vertical direction corresponds to the c-axis direction and a plane perpendicular to the c-axis direction corresponds to the a–b plane, unless otherwise specified. When the expressions "an upper half" and "a lower half" are simply used, they refer to an upper half above the a–b plane and a lower half below the a–b plane (an upper half and a lower half with respect to the a–b plane).

Figure 15A:
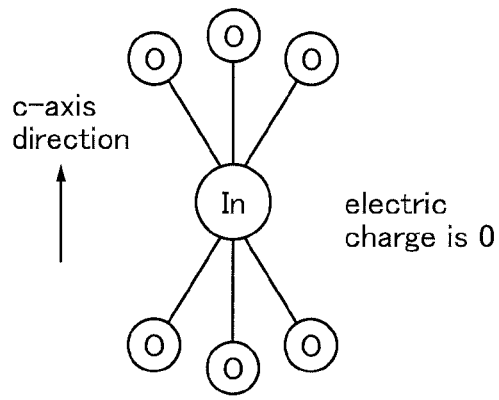
FIGS. 15A to 15E illustrate crystal structures of an oxide semiconductor.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, charge is 0.

Figure 15D:
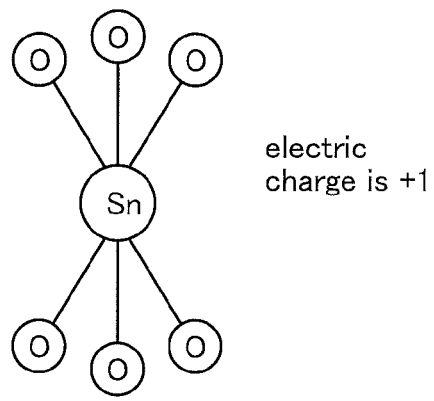
Figure 15B:
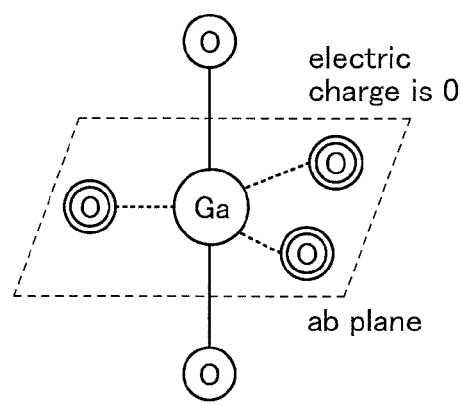

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a–b plane. One tetracoordinate O atom exists in each of an upper half and a lower half in FIG. 15B. An In atom can also have the structure illustrated in FIG. 15B because an In atom can have five ligands. In the small group illustrated in FIG. 15B, charge is 0.

Figure 15E:
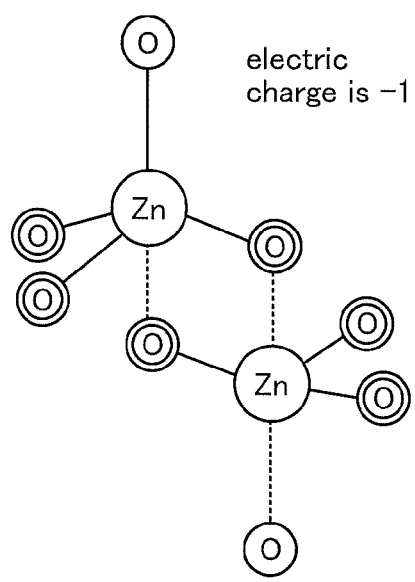
Figure 15C:
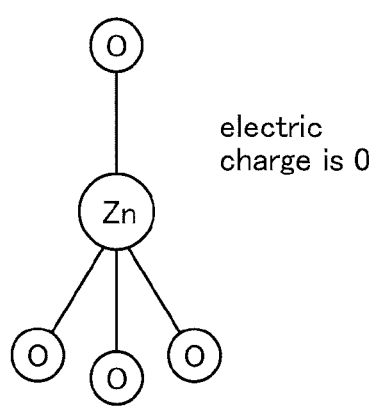

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. In the small group illustrated in FIG. 15C, charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, charge is +1.

FIG. 15E illustrates a small group including two Zn atoms. In FIG. 15E, one tetracoordinate O atom exists in each of an upper half and a lower half. In the small group illustrated in FIG. 15E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 17A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate o atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total charge of the layered structure is 0.

Figure 16A:
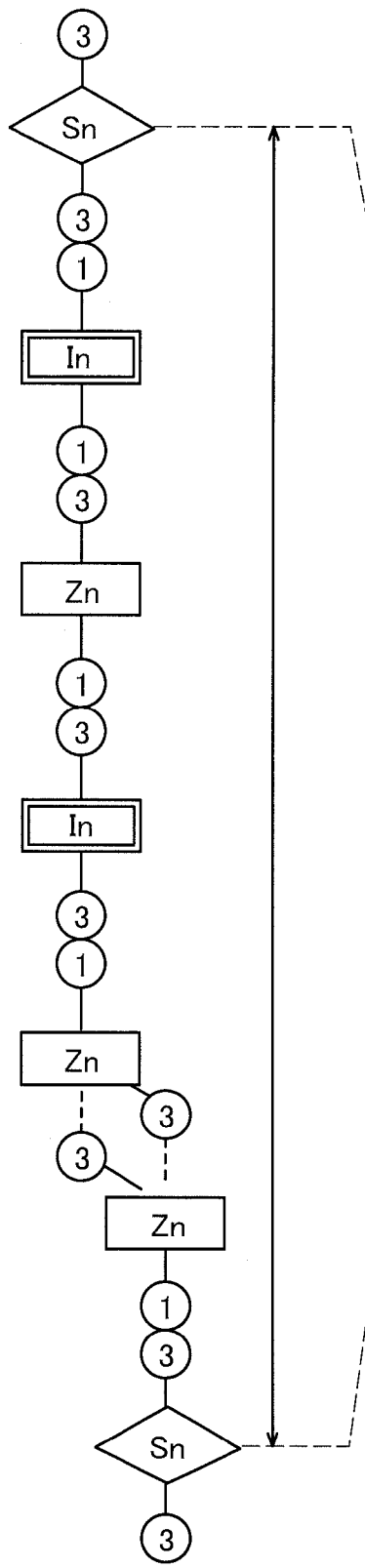
FIGS. 16A to 16C illustrate crystal structures of an oxide semiconductor.
Figure 16B:
Figure 16C:
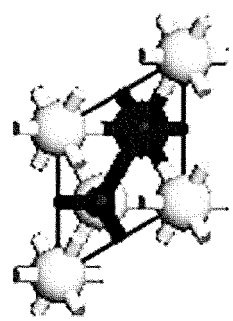

FIG. 16A illustrates a model of a medium group included in a layered structure of an In—Sn—Zn—O-based material. FIG. 16B illustrates a large group including three medium groups. Note that FIG. 16C illustrates an atomic arrangement in the case where the layered structure in FIG. 16B is observed from the c-axis direction.

In FIG. 16A, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as illustrated in FIG. 15E can be given. For example, with one small group including two Zn atoms, charge of one small group including a Sn atom can be cancelled, so that the total charge of the layered structure can be 0.

When the large group illustrated in FIG. 16B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an In—Sn—Ga—Zn-based oxide which is an oxide of four metal elements; an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Gf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, which is an oxide of three metal elements; an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide which is an oxide of two metal elements; an In-based oxide, a Sn-based oxide, or a Zn-based oxide, which is an oxide of single metal element; and the like.

Figures 17A, 17B, 17C:
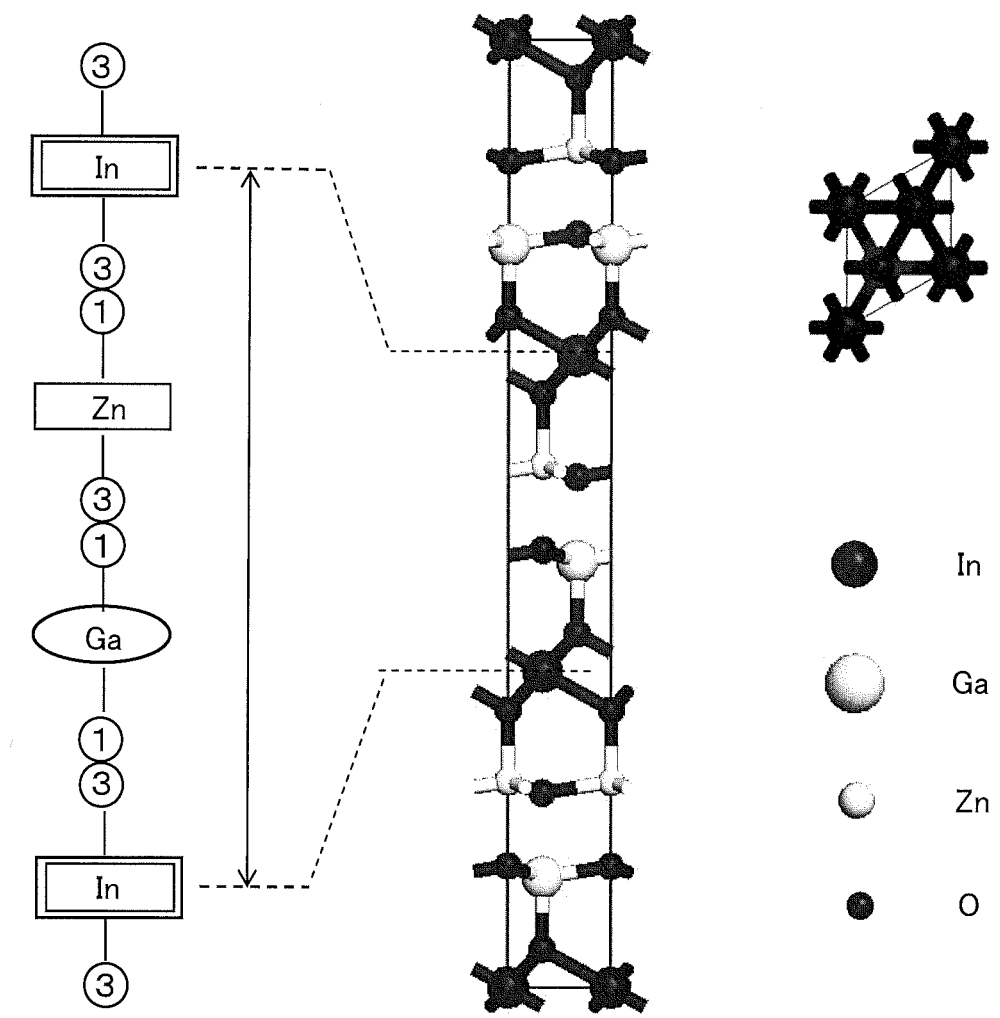
FIGS. 17A to 17C illustrate crystal structures of an oxide semiconductor.

As an example, FIG. 17A illustrates a model of a medium group included in a layered structure of an In—Ga—Zn—O-based material.

In the medium group included in the layered structure of the In—Ga—Zn—O-based material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 17B illustrates a large group including three medium groups. Note that FIG. 17C illustrates an atomic arrangement in the case where the layered structure in FIG. 17B is observed from the c-axis direction.

Here, since charge of a (hexacoordinate or pentacoordinate) In atom, charge of a (tetracoordinate) Zn atom, and charge of a (pentacoordinate) Ga atom are +3, +2, +3, respectively, charge of a small group including any of an In atom, a Zn atom, and a Ga atom is 0. As a result, the total charge of a medium group having a combination of such small groups is always 0.

In order to form the layered structure of the In—Ga—Zn—O-based material, a large group can be formed using not only the medium group illustrated in FIG. 17A but also a medium group in which the arrangement of the In atom, the Ga atom, and the Zn atom is different from that in FIG. 17A.

When the large group illustrated in FIG. 17B is repeated, an In—Sn—Zn—O-based crystal can be obtained. Note that a layered structure of the obtained In—Ga—Zn—O-based crystal can be expressed as a composition formula, $InGaO_3(ZnO)_n$ (n is a natural number).

Figure 32A:
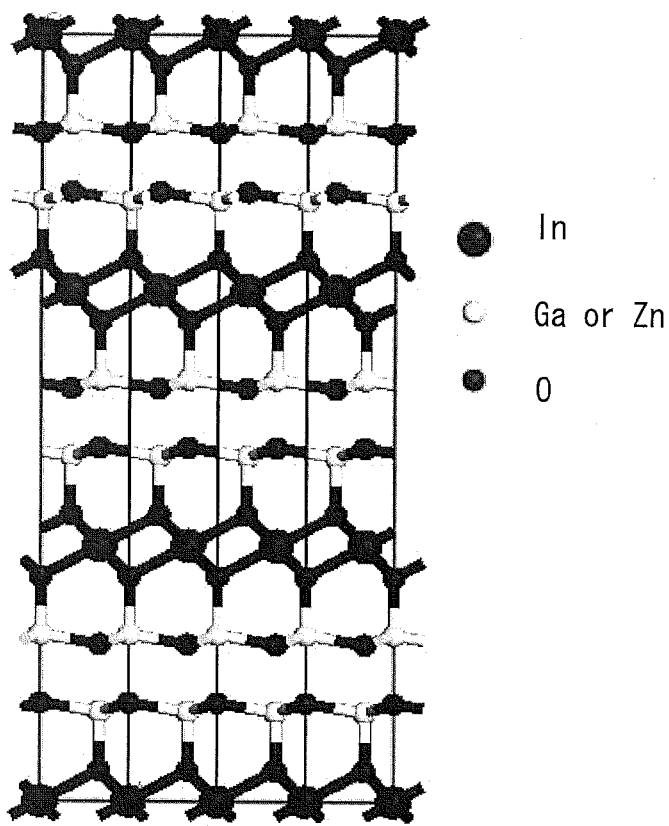
FIGS. 32A and 32B each illustrate a crystal structure of an oxide semiconductor.

In the case where n=1 ($InGaZnO_4$), a crystal structure illustrated in FIG. 32A can be obtained, for example. Note that in the crystal structure in FIG. 32A, since a Ga atom and an In atom each have five ligands as described in FIG. 15B, a structure in which Ga is replaced with In can be obtained.

Figure 32B:
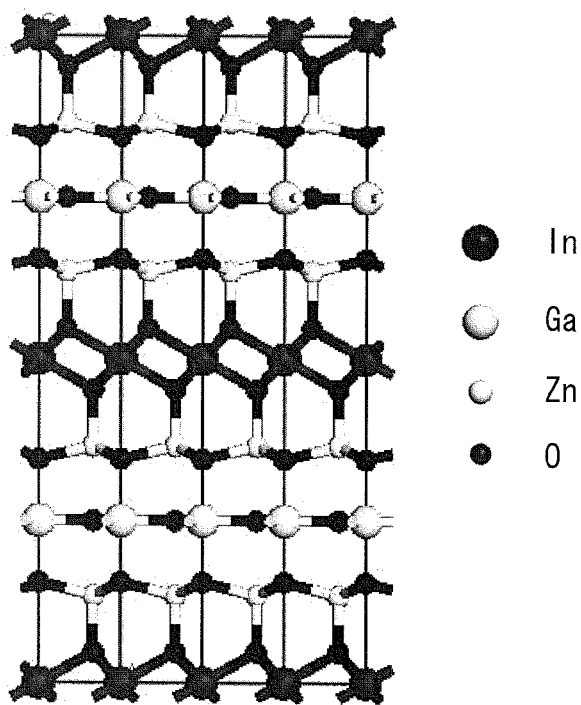

In the case where n=2 ($InGaZn_2O_5$), a crystal structure illustrated in FIG. 32B can be obtained, for example. Note that in the crystal structure in FIG. 15B, since a Ga atom and an In atom each have five ligands as described in FIG. 32B, a structure in which Ga is replaced with In can be obtained.

<Mobility of Transistor Whose Channel Region is Formed Using Oxide Semiconductor>

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

[FORMULA 2]

$$\mu = \mu_0 \exp\left(-\frac{E}{kT}\right) \tag{A2}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

[FORMULA 3]

$$E = \frac{e^2 N^2}{8\varepsilon n} = \frac{e^3 N^2 t}{8\varepsilon C_{ox} V_g} \tag{A3}$$

Here, e represents the elementary charge, N represents the average defect density per unit area in a channel, ε represents the permittivity of the semiconductor, n represents the number of carriers per unit area in the channel, $C_{ox}$ represents the capacitance per unit area, $V_g$ represents the gate voltage, and t represents the thickness of the channel In the case where the thickness of the semiconductor layer is less than or equal to 30 nm, the thickness of the channel may be regarded as being the same as the thickness of the semiconductor layer. The drain current $I_d$ in a linear region can be expressed as the following formula.

[FORMULA 4]

$$I_d = \frac{W\mu V_g V_d C_{ox}}{L} \exp\left(-\frac{E}{kT}\right) \tag{A4}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

[FORMULA 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \tag{A5}$$

The right side of Formula (A5) is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/cm^2$.

On the basis of the defect density obtained in this manner, $\mu_0$ can be calculated to be 120 $cm^2$/Vs from Formula (A2) and Formula (A3). The measured mobility of an In—Sn—Zn oxide including a defect is approximately 35 $cm^2$/Vs. However, assuming that no defect exists inside the semiconductor and at the interface between the semiconductor and an insulating film, the mobility $\mu_0$ of the oxide semiconductor is expected to be 120 $cm^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following equation.

[FORMULA 6]

$$\frac{1}{\mu_1} = \frac{1}{\mu_0} + \frac{D}{B} \exp\left(-\frac{x}{G}\right) \tag{A6}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula (A6) is increased and accordingly the mobility $\mu_1$ is decreased.

Figure 18:
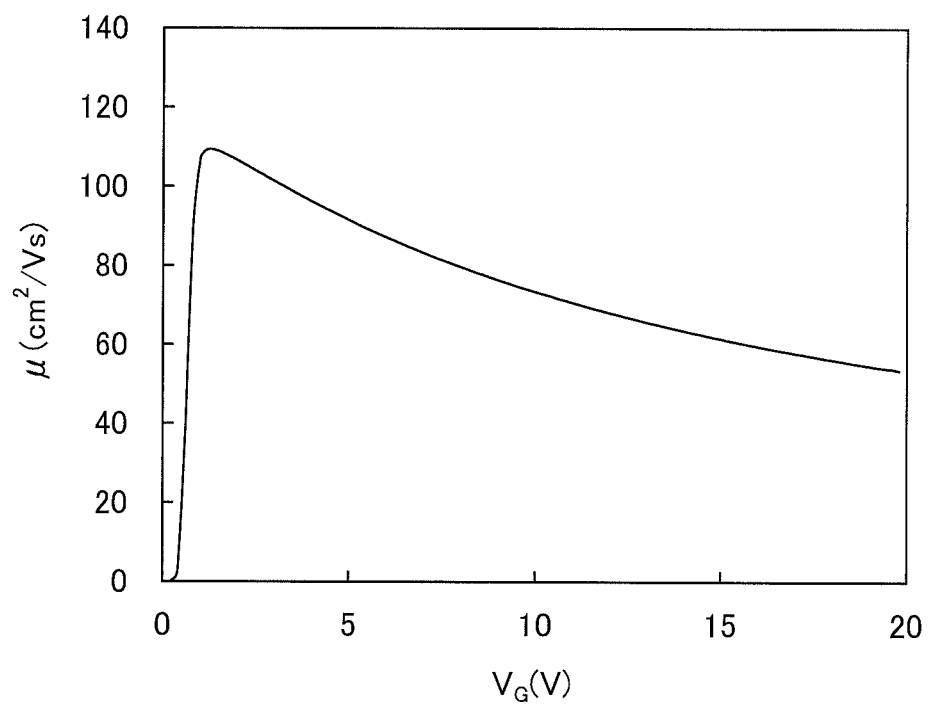
FIG. 18 illustrates gate voltage dependence of mobility obtained by calculation.

Calculation results of the mobility $\mu_2$ of a transistor whose channel includes an ideal oxide semiconductor without a defect inside the semiconductor are shown in FIG. 18. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of more than 100 $cm^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are fabricated using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 303a and a semiconductor region 303c which have $n^+$-type conductivity in an oxide semiconductor layer. The resistivities of the semiconductor region 303a and the semiconductor region 303c are $2\times10^{-3}$ Ωcm.

The transistor illustrated in FIG. 22A is formed over a base insulating layer 301 and an embedded insulator 302 which is embedded in the base insulating layer 301 and formed of aluminum oxide. The transistor includes the semiconductor region 303a, the semiconductor region 303c, an intrinsic semiconductor region 303b serving as a channel region therebetween, and a gate 305. The width of the gate 305 is 33 nm.

A gate insulating layer 304 is formed between the gate 305 and the semiconductor region 303b. In addition, a sidewall insulator 306a and a sidewall insulator 306b are formed on both side surfaces of the gate 305, and an insulator 307 is formed over the gate 305 so as to prevent a short circuit between the gate 305 and another wiring. The sidewall insulator has a width of 5 nm. A source 308a and a drain 308b are provided in contact with the semiconductor region 303a and the semiconductor region 303c, respectively. Note that the channel width of this transistor is 40 nm.

The transistor of FIG. 22B is the same as the transistor of FIG. 22A in that it is formed over the base insulating layer 301 and the embedded insulator 302 formed of aluminum oxide and that it includes the semiconductor region 303a, the semiconductor region 303c, the intrinsic semiconductor region 303b positioned therebetween, the gate 305 having a width of 33 nm, the gate insulating layer 304, the sidewall insulator 306a, the sidewall insulator 306b, the insulator 307, the source 308a, and the drain 308b.

The transistor illustrated in FIG. 22A is different from the transistor illustrated in FIG. 22B in the conductivity type of semiconductor regions under the sidewall insulator 306a and the sidewall insulator 306b. In the transistor illustrated in FIG. 22A, the semiconductor regions under the sidewall insulator 306a and the sidewall insulator 306b are part of the semiconductor region 303a having $n^+$-type conductivity and part of the semiconductor region 303c having $n^+$-type conductivity, whereas in the transistor illustrated in FIG. 22B, the semiconductor regions under the sidewall insulator 306a and the sidewall insulator 306b are part of the intrinsic semiconductor region 303b. In other words, a region having a width of Loff which overlaps with neither the semiconductor region 303a (the semiconductor region 303c) nor the gate 305 is provided. This region is called an offset region, and the width Loff is called an offset length. As is seen from the drawing, the offset length is equal to the width of the sidewall insulator 306a (the sidewall insulator 306b).

Figure 19A:
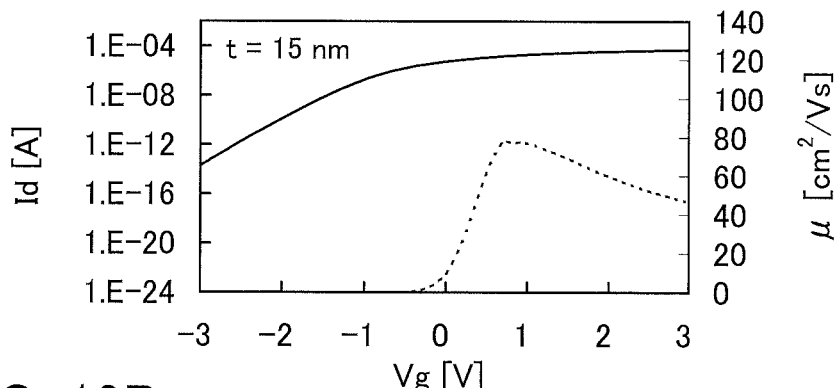
FIGS. 19A to 19C illustrate gate voltage dependence of drain current and mobility obtained by calculation.
Figure 19B:
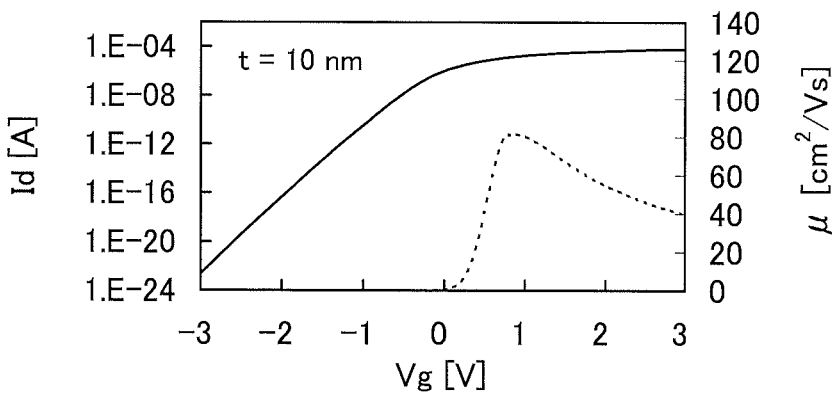
Figure 19C:
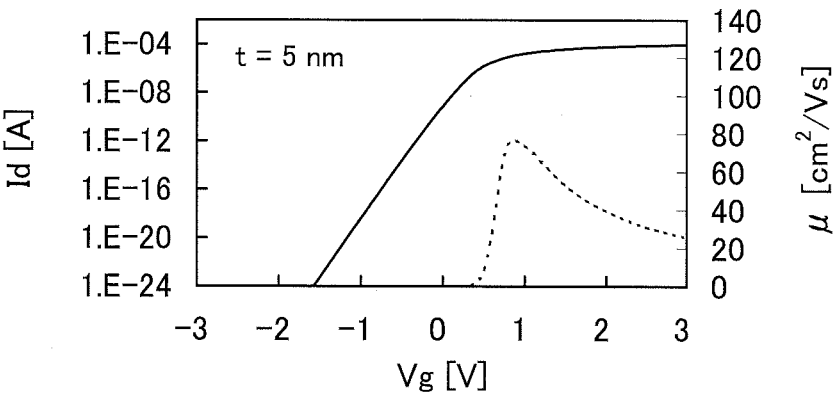

The other parameters used in calculation are as described above. For the calculation, device simulation software Sentaurus Device manufactured by Synopsys, Inc. was used. FIGS. 19A to 19C show the gate voltage ($V_g$: a potential difference between the gate and the source) dependence of the drain current ($I_d$, a solid line) and the mobility ($\mu$, a dotted line) of the transistor having the structure illustrated in FIG. 22A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility $\mu$ and the drain current $I_d$ in an on state (on-state current). The graphs show that the drain current exceeds 10 µA, which is required in a memory element and the like, at a gate voltage of around 1 V.

Figure 20A:
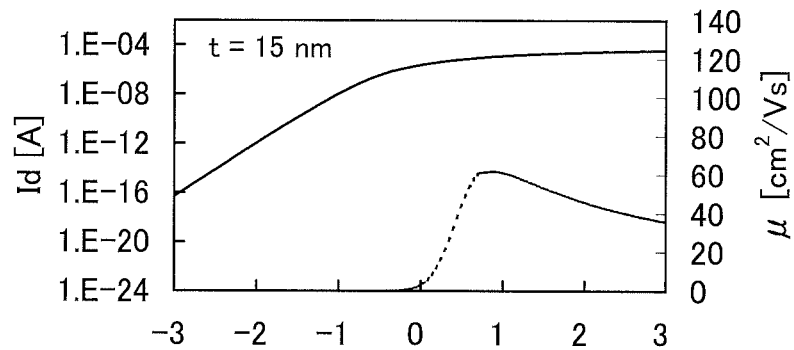
FIGS. 20A to 20C illustrate gate voltage dependence of drain current and mobility obtained by calculation.
Figure 20B:
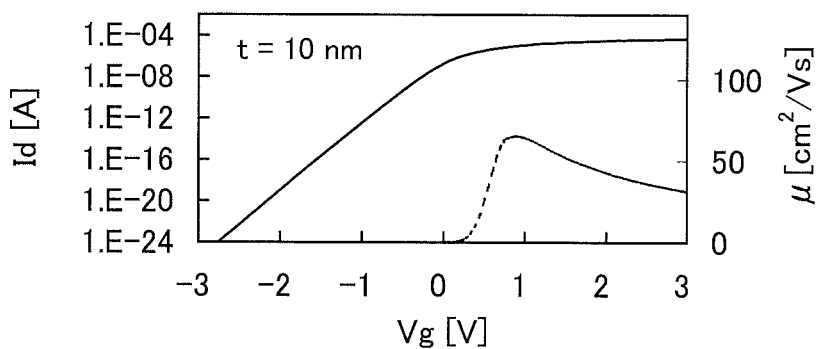
Figure 20C:
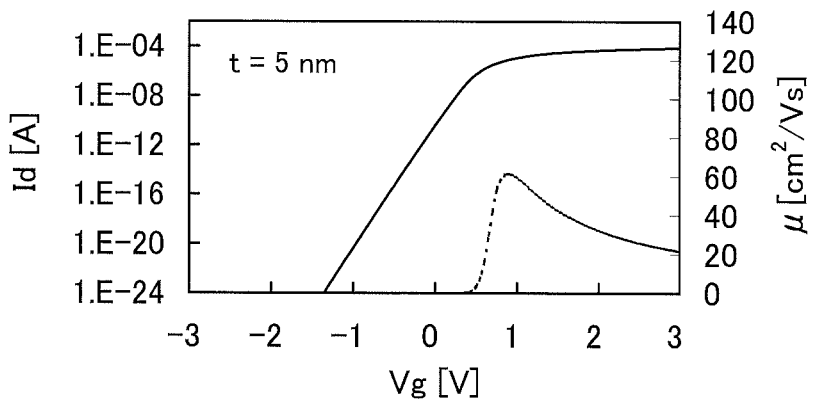

FIGS. 20A to 20C show the gate voltage $V_g$ dependence of the drain current $I_d$ (a solid line) and the mobility $\mu$ (a dotted line) of the transistor having the structure illustrated in FIG. 22B where the offset length Loff is 5 nm. The drain current $I_d$ is obtained by calculation under the assumption that the drain voltage is +1 V and the mobility $\mu$ is obtained by calculation under the assumption that the drain voltage is +0.1 V. FIG. 20A shows the gate voltage dependence of the transistor in the case where the thickness of the gate insulating film is 15 mm, FIG. 20B shows that of the transistor in the case where the thickness of the gate insulating film is 10 nm, and FIG. 20C shows that of the transistor in the case where the thickness of the gate insulating film is 5 nm.

Figure 21A:
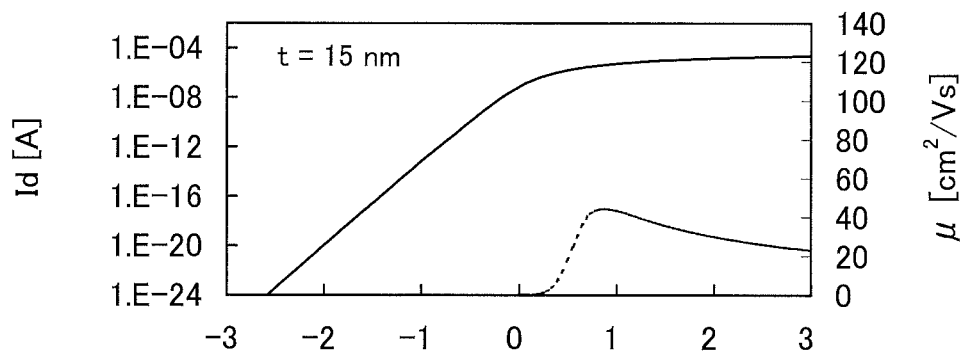
FIGS. 21A to 21C illustrate the gate voltage dependence of drain current and mobility obtained by calculation.
Figure 21B:
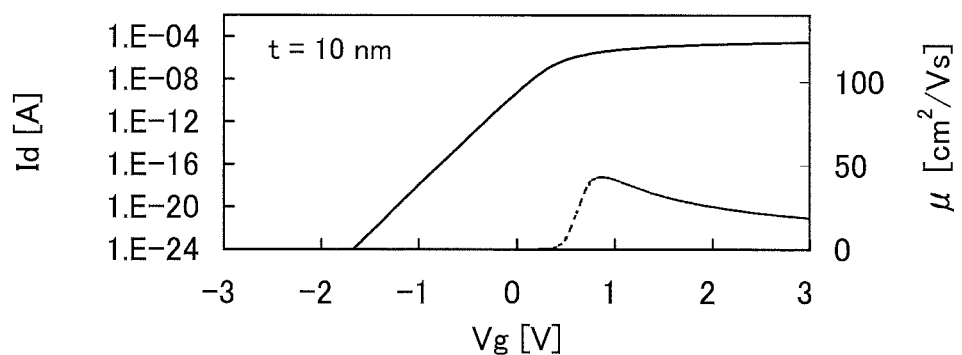
Figure 21C:
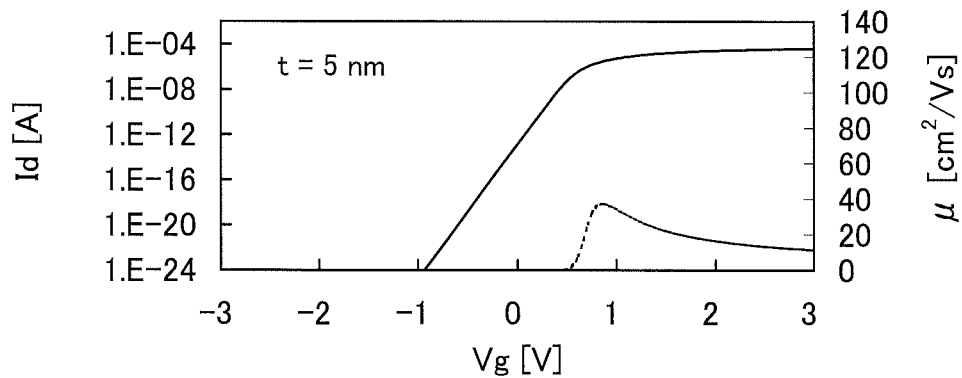
Figure 22A:
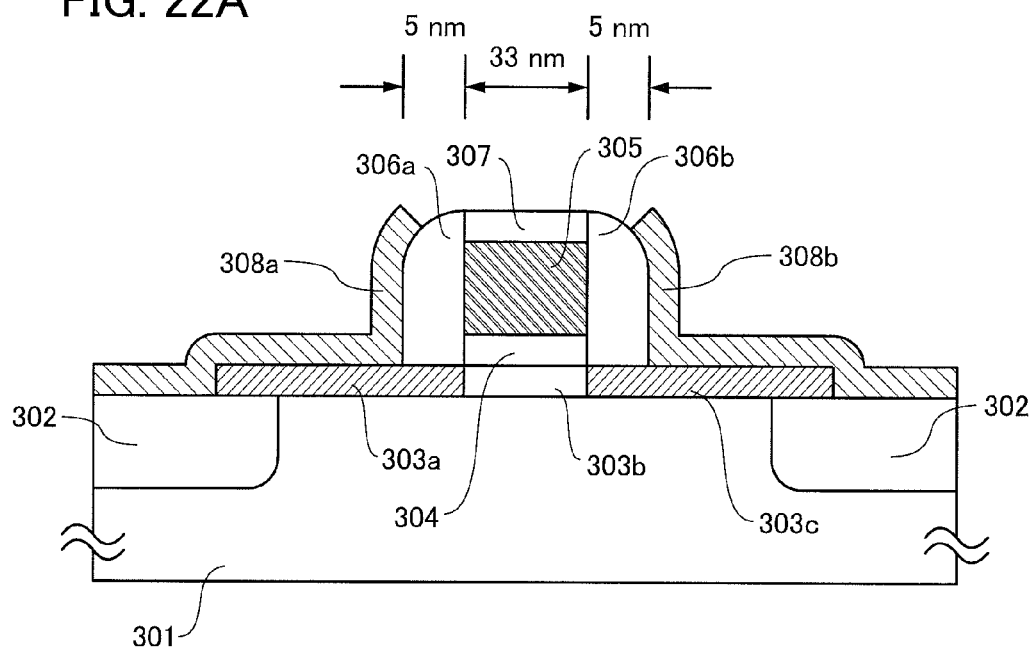
FIGS. 22A and 22B illustrate cross-sectional structures of transistors used for simulation.
Figure 22B:
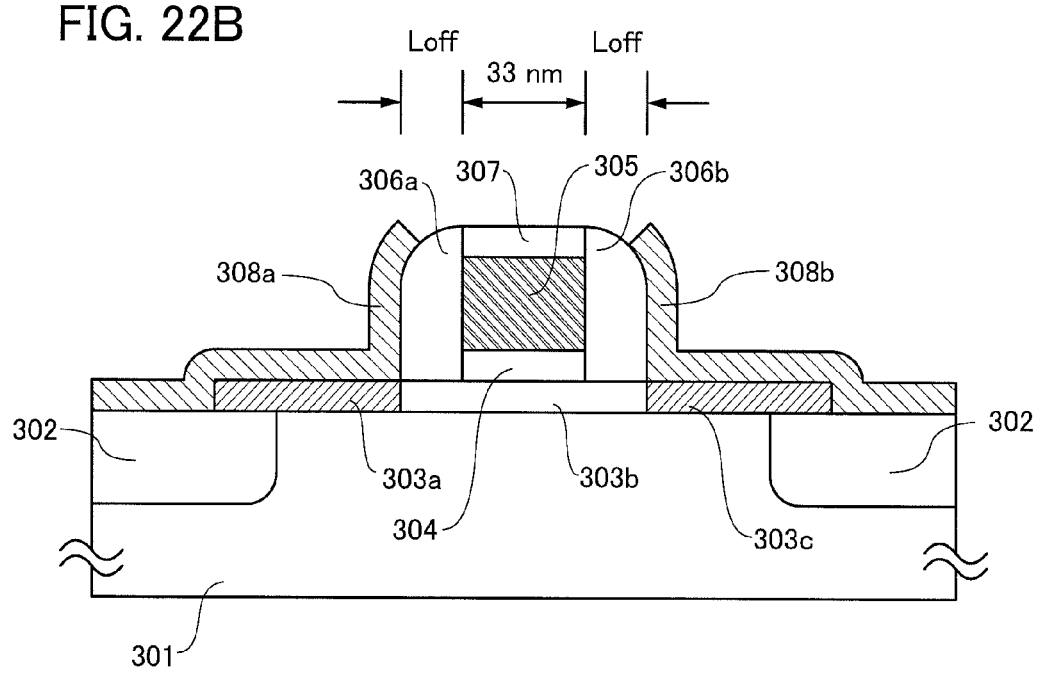

Further, FIGS. 21A to 21C show the gate voltage dependence of the drain current $I_d$ (a solid line) and the mobility (a dotted line) of the transistor having the structure illustrated in FIG. 22B where the offset length Loff is 15 nm. The drain current $I_d$ is obtained by calculation under the assumption that the drain voltage is +1 V and the mobility $\mu$ is obtained by calculation under the assumption that the drain voltage is +0.1 V. FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 $cm^2/Vs$ in FIGS. 19A to 19C, approximately 60 $cm^2/Vs$ in FIGS. 20A to 20C, and approximately 40 $cm^2/Vs$ in FIGS. 21A to 21C; thus, the peak of the mobility $\mu$ is decreased as the offset length Loff is increased. Further, the same applies to the off-state current. The on-state current is also decreased as the offset length Loff is increased; however, the decrease in the on-state current is much more gradual than the decrease in the off-state current. Further, the graphs show that in either of the structures, the drain current exceeds 10 µA, which is required in a memory element and the like, at a gate voltage of around 1 V.

<Off-State Current of Transistor Whose Channel Region is Formed Using Oxide Semiconductor>

Here, results of measuring the off-state current (leakage current) of a transistor whose channel region includes an oxide semiconductor will be described.

First, a method for fabricating a transistor used for the measurement will be described with reference to FIGS. 3A to 3H.

Figure 3A:
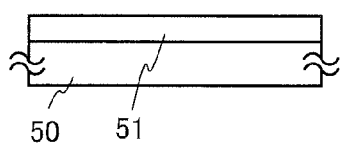
FIGS. 3A to 3H illustrate an example of a method for forming a transistor.
Figure 3B:
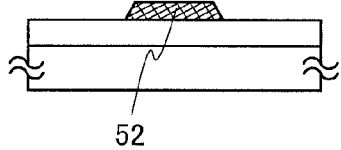

First, a base layer 51 formed of a stack of a 100-nm-thick silicon nitride layer and a 150-nm-thick silicon oxynitride layer was formed by CVD over a glass substrate 50 (see FIG. 3A).

Next, a 100-nm-thick tungsten layer was formed by sputtering over the base layer 51. Then, the tungsten layer was selectively etched by photolithography, so that a gate layer 52 was formed (see FIG. 3B).

Figure 3C:
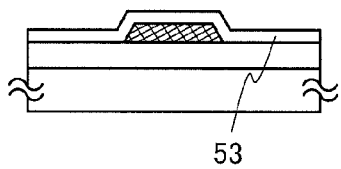
Figure 3D:
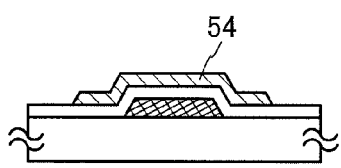
Figure 3E:
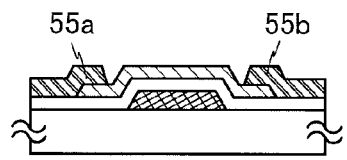
Figure 3F:
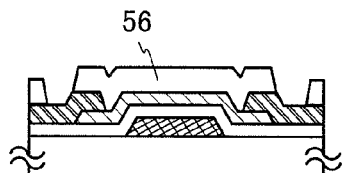

Next, a gate insulating layer 53 formed of a 100-nm-thick silicon oxynitride layer was formed by CVD over the base layer 51 and the gate layer 52 (see FIG. 3C).

Then, a 25-nm-thick oxide semiconductor layer was formed by sputtering over the gate insulating layer 53. A metal oxide target having a composition ratio of $In_2O_3$:$Ga_2O_3$:ZnO=1:1:2 [molar ratio] was used for forming the oxide semiconductor layer. In addition, the oxide semiconductor layer was formed under the following conditions: the substrate temperature was 200° C., the internal pressure of the chamber was 0.6 Pa, the direct-current power was 5 kW, and the atmosphere was a mixed atmosphere of oxygen and argon (the oxygen flow rate was 50 sccm and the argon flow rate was 50 sccm). Then, the oxide semiconductor layer was selectively etched by photolithography, so that an oxide semiconductor layer 54 was formed (see FIG. 3D).

Subsequently, heat treatment was performed at 450° C. for one hour in a mixed atmosphere of nitrogen and oxygen (the percentage of nitrogen was 80% and that of oxygen was 20%).

Then, the gate insulating layer 53 was selectively etched by photolithography (not illustrated). Note that this etching is a step of forming a contact hole for connecting the gate layer 52 and a conductive layer to be formed.

Next, a stack of a 100-nm-thick titanium layer, a 200-nm-thick aluminum layer, and a 100-nm-thick titanium layer was formed by sputtering over the gate insulating layer 53 and the oxide semiconductor layer 54. Then, the stack was selectively etched by photolithography, so that a source layer 55a and a drain layer 55b were formed (see FIG. 3E).

Then, heat treatment was performed at 300° C. for one hour in a nitrogen atmosphere.

Next, a protective insulating layer 56 formed of a 300-nm-thick silicon oxide layer was formed over the gate insulating layer 53, the oxide semiconductor layer 54, the source layer 55a, and the drain layer 55b. Then, the protective insulating layer 56 was selectively etched by photolithography (see FIG. 3F). Note that this etching is a step of forming a contact hole for connecting the gate layer and a conductive layer to be formed, a contact hole for connecting the source layer and a conductive layer to be formed, and a contact hole for connecting the drain layer and a conductive layer to be formed.

Figure 3G:
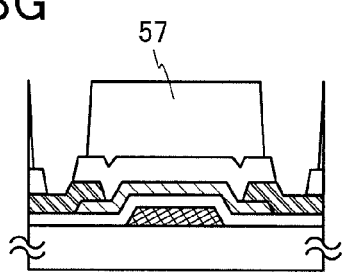
Figure 3H:
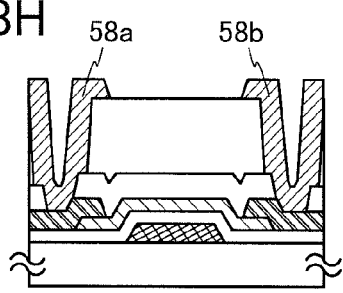

Next, a 1.5-μm-thick acrylic layer was applied over the protective insulating layer 56 and selectively exposed to light, so that a planarization insulating layer 57 was formed (see FIG. 3G). Then, the planarization insulating layer 57 formed of the acrylic layer was baked with heat treatment at 250° C. for one hour in a nitrogen atmosphere.

Subsequently, a 200-nm-thick titanium layer was formed by sputtering over the planarization insulating layer 57. Then, the titanium layer was selectively etched by photolithography, thereby forming the conductive layer (not illustrated) connected to the gate layer 52, a conductive layer 58a connected to the source layer 55a, and a conductive layer 58b connected to the drain layer 55b (see FIG. 3H).

Next, heat treatment was performed at 250° C. for one hour in a nitrogen atmosphere.

Through the above steps, the transistor used for the measurement was fabricated.

Next, a method for calculating the value of off-state current by using a circuit for evaluating characteristics, used in the measurement, will be described below.

Figure 4A:
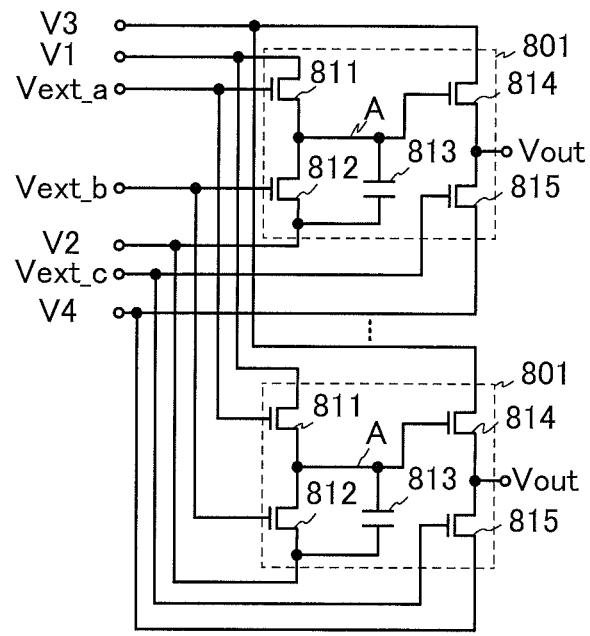
FIGS. 4A to 4C are diagrams for explaining a method for measuring off-state current of a transistor.
Figure 4B:
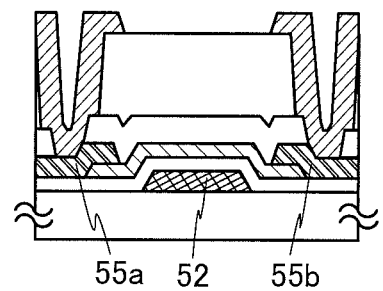
Figure 4C:
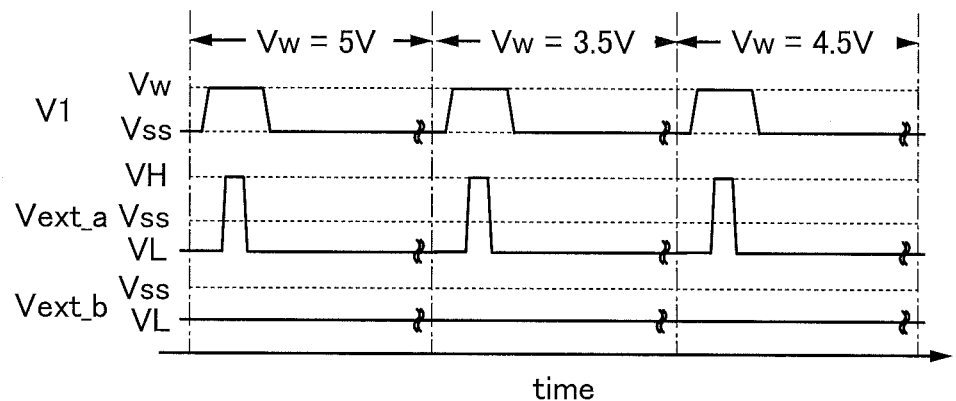

Current measurement using a circuit for evaluating characteristics will be described with reference to FIGS. 4A to 4C. FIGS. 4A to 4C are diagrams for explaining a circuit for evaluating characteristics.

First, a configuration of a circuit for evaluating characteristics is described with reference to FIG. 4A. FIG. 4A is a circuit diagram illustrating the configuration of the circuit for evaluating characteristics.

The circuit for evaluating characteristics illustrated in FIG. 4A includes a plurality of measurement systems 801. The plurality of measurement systems 801 are connected in parallel with each other. Here, eight measurement systems 801 are connected in parallel with each other. By using the plurality of measurement systems 801, a plurality of leakage currents can be measured at the same time.

The measurement system 801 includes a transistor 811, a transistor 812, a capacitor 813, a transistor 814, and a transistor 815.

The transistors 811, 812, 814, and 815 are n-channel field effect transistors.

A voltage V1 is input to one of a source and a drain of the transistor 811. A voltage Vext_a is input to a gate of the transistor 811. The transistor 811 is a transistor for injecting charge.

One of a source and a drain of the transistor 812 is connected to the other of the source and the drain of the transistor 811. A voltage V2 is input to the other of the source and the drain of the transistor 812. A voltage Vext_b is input to a gate of the transistor 812. The transistor 812 is a transistor for evaluating leakage current. Note that "leakage current" here refers to leakage current including off-state current of the transistor.

One electrode of the capacitor 813 is connected to the other of the source and the drain of the transistor 811. The voltage V2 is input to the other electrode of the capacitor 813. Here, the voltage V2 is 0 V.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, the one of the source and the drain of the transistor 812, and the one electrode of the capacitor 813 are connected to each other is referred to as a node A. Here, the voltage V3 is 5 V.

One of a source and a drain of the transistor 815 is connected to the other of the source and the drain of the transistor 814. A voltage V4 is input to the other of the source and the drain of the transistor 815. A voltage Vext_c is input to a gate of the transistor 815. Here, the voltage Vext_c is 0.5 V.

The measurement system 801 outputs a voltage at a portion where the other of the source and the drain of the transistor 814 is connected to the one of the source and the drain of the transistor 815, as an output voltage Vout.

Here, as the transistor 811, a transistor that is fabricated by the fabrication method described with reference to FIGS. 3A to 3H and has a channel length L of 10 μm and a channel width W of 10 μm is used.

As the transistors 814 and 815, a transistor that is fabricated by the fabrication method described with reference to FIGS. 3A to 3H and has a channel length L of 3 μm and a channel width W of 100 μm is used.

At least the transistor 812 includes a 1-μm-wide offset region in which the gate layer 52 does not overlap with the source layer 55a and the drain layer 55b as illustrated in FIG. 4B. By providing the offset region, parasitic capacitance can be reduced. Further, as the transistor 812, six samples (SMP) of transistors having different channel lengths L and channel widths W are used (see Table 1).

TABLE 1

|  | L [μm] | W [μm] |
| --- | --- | --- |
| SMP1 | 1.5 | $1 \times 10^5$ |
| SMP2 | 3 | $1 \times 10^5$ |
| SMP3 | 10 | $1 \times 10^5$ |
| SMP4 | 1.5 | $1 \times 10^6$ |
| SMP5 | 3 | $1 \times 10^6$ |
| SMP6 | 10 | $1 \times 10^6$ |

The transistor for injecting charge and the transistor for evaluating leakage current are separately provided as illustrated in FIG. 4A, so that the transistor for evaluating leakage current can be always kept off while charge is injected.

In addition, the transistor for injecting charge and the transistor for evaluating leakage current are separately provided, whereby each transistor can have an appropriate size. When the channel width W of the transistor for evaluating leakage current is made larger than that of the transistor for injecting charge, leakage current components of the circuit for evaluating characteristics other than the leakage current of the transistor for evaluating leakage current can be made relatively small. As a result, the leakage current of the transistor for evaluating leakage current can be measured with high accuracy. In addition, since the transistor for evaluating leakage current does not need to be turned on at the time of charge injection, the measurement is not adversely affected by variation in the voltage of the node A, which is caused when part of charge in the channel region of the transistor for evaluating leakage current flows into the node A.

Next, a method for measuring leakage current of the circuit for evaluating characteristics illustrated in FIG. 4A will be described with reference to FIG. 4C. FIG. 4C is a timing chart for explaining the method for measuring leakage current with use of the circuit for evaluating characteristics illustrated in FIG. 4A.

In the method for measuring the leakage current with the circuit for evaluating characteristics illustrated in FIG. 4A, a writing period and a storage period are provided. The operation in each period is described below.

In the writing period, a voltage VL (−3 V) with which the transistor 812 is turned off is input as the voltage Vext_b. Further, a write voltage Vw is input as the voltage V1, and then, a voltage VH (5 V) with which the transistor 811 is turned on is input as the voltage Vext_a for a given period. Thus, charge is accumulated in the node A, and the voltage of the node A becomes equivalent to the write voltage Vw. Then, the voltage VL with which the transistor 811 is turned off is input as the voltage Vext_a. After that, a voltage VSS (0 V) is input as the voltage V1.

In the storage period, the amount of change in the voltage of the node A, caused by change in the amount of the charge stored in the node A, is measured. From the amount of change in the voltage, the value of the current flowing between the source and the drain of the transistor 812 can be calculated. In the above manner, charge can be accumulated in the node A, and the amount of change in the voltage of the node A can be measured.

Accumulation of charge in the node A and measurement of the amount of change in the voltage of the node A (also referred to as an accumulation and measurement operation) are repeatedly performed. First, a first accumulation and measurement operation is repeated 15 times. In the first accumulation and measurement operation, a voltage of 5 V is input as the write voltage Vw in the writing period and retained for one hour in the storage period. Next, a second accumulation and measurement operation is repeated twice. In the second accumulation and measurement operation, a voltage of 3.5 V is input as the write voltage Vw in the writing period and retained for 50 hours in the storage period. Next, a third accumulation and measurement operation is performed once. In the third accumulation and measurement operation, a voltage of 4.5 V is input as the write voltage Vw in the writing period and retained for 10 hours in the storage period. By repeating the accumulation and measurement operation, the measured current value can be confirmed to be the value in the steady state. In other words, the transient current (a current component that decreases over time after the measurement starts) can be removed from current $I_A$ flowing through the node A. Consequently, the leakage current can be measured with higher accuracy.

In general, a voltage $V_A$ of the node A is expressed as a function of the output voltage Vout by Formula 1.

[Formula 7]

$$V_A = F(V_{out}) \quad (1)$$

Electric charge $Q_A$ of the node A is expressed by Formula 2, using the voltage $V_A$ of the node A, capacitance $C_A$ connected to the node A, and a constant (const). Here, the capacitance $C_A$ connected to the node A is the sum of the capacitance of the capacitor 813 and a capacitance other than that of the capacitor 813.

[Formula 8]

$$Q_A = C_A V_A + \text{const} \quad (2)$$

Since the current $I_A$ of the node A is the time differential of charge flowing into the node A (or charge flowing from the node A), the current $I_A$ of the node A is expressed by Formula 3.

[Formula 9]

$$I_A = \frac{\Delta Q_A}{\Delta t} = \frac{C_A \cdot \Delta F(Vout)}{\Delta t} \quad (3)$$

Here, Δt is about 54000 sec. As above, the current $I_A$ of the node A, which is the leakage current, can be calculated with the capacitance $C_A$ connected to the node A and the output voltage Vout, so that the leakage current of the circuit for evaluating characteristics can be obtained.

Next, the results of measuring the output voltage by the measurement method using the above circuit for evaluating characteristics and the value of the leakage current of the circuit for evaluating characteristics, which is calculated from the measurement results, will be described with reference to FIGS. 5A and 5B.

Figure 5A:
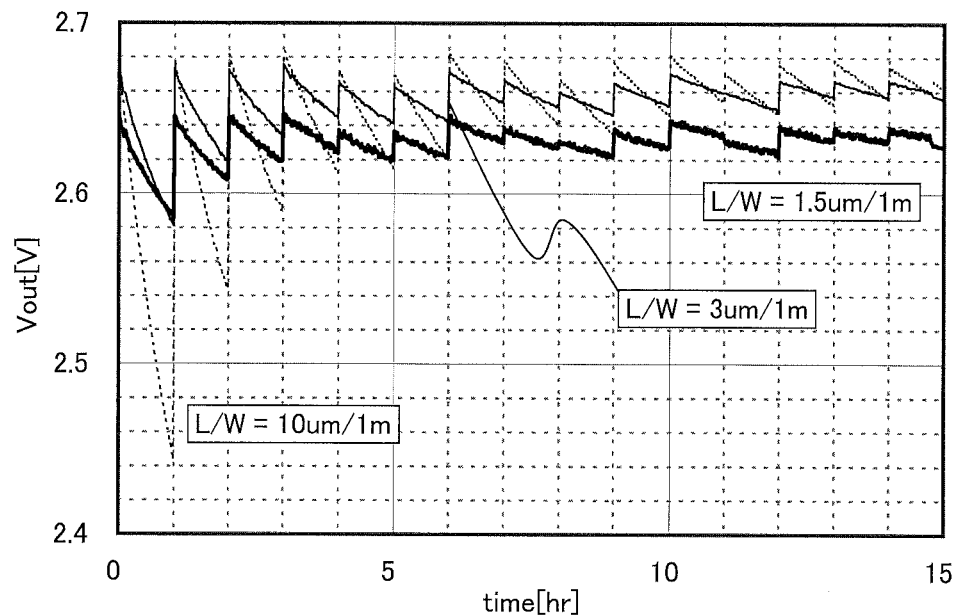
FIGS. 5A to 5B illustrate characteristics of transistors.
Figure 5B:
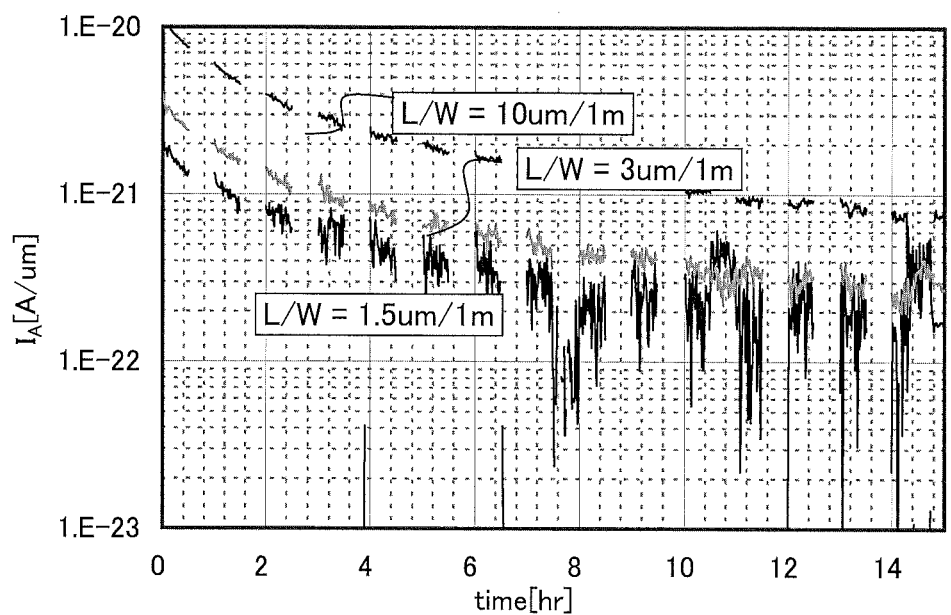

As an example, FIG. 5A shows the relation between the elapsed time Time of the above measurement (the first accumulation and measurement operation) of the transistors SMP4, SMP5, and SMP6 and the output voltage Vout. FIG. 5B shows the relation between the elapsed time Time of the above measurement and the current $I_A$ calculated by the measurement. It is found that the output voltage Vout varies after the measurement starts and it takes 10 hours or longer to reach a steady state.

Figure 6:
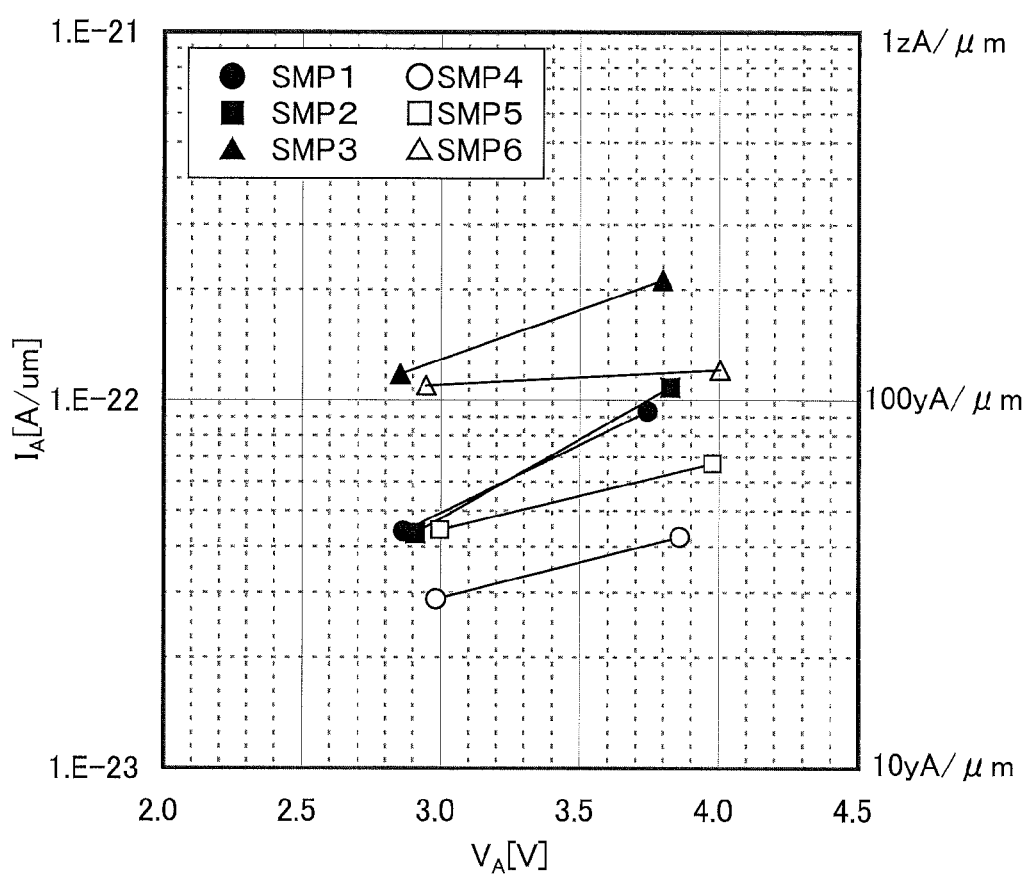
FIG. 6 illustrates characteristics of a transistor.

FIG. 6 shows the relation between the voltage of the node A in SMP1 to SMP6 and the leakage current (here, current per micrometer of channel width) estimated by the above measurement. In SMP4 in FIG. 6, for example, when the voltage of the node A is 3.0 V, the leakage current is 28 yA/μm. Since the leakage current includes the off-state current of the transistor 812, the off-state current of the transistor 812 can be considered to be 28 yA/μm or lower.

Figure 7:
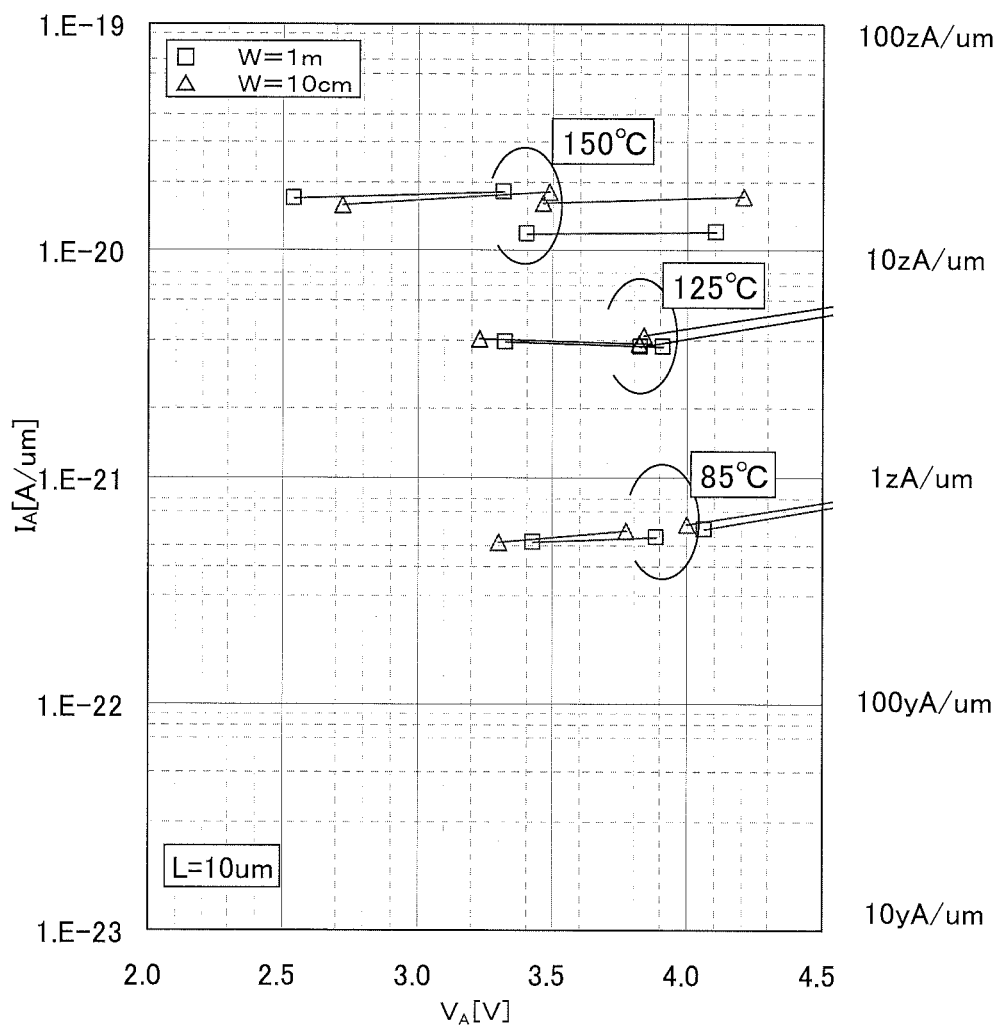
FIG. 7 illustrates characteristics of a transistor.
Figure 8:
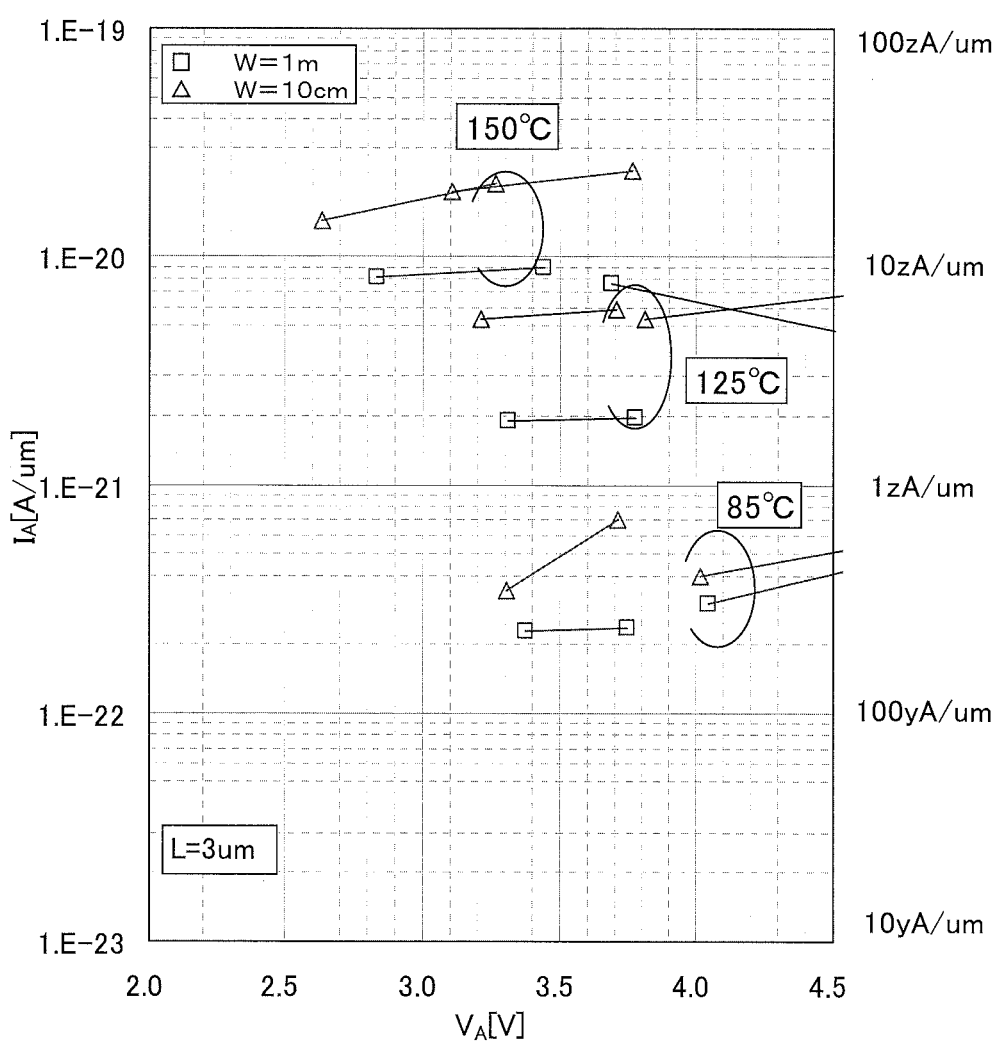
FIG. 8 illustrates characteristics of a transistor.
Figure 9:
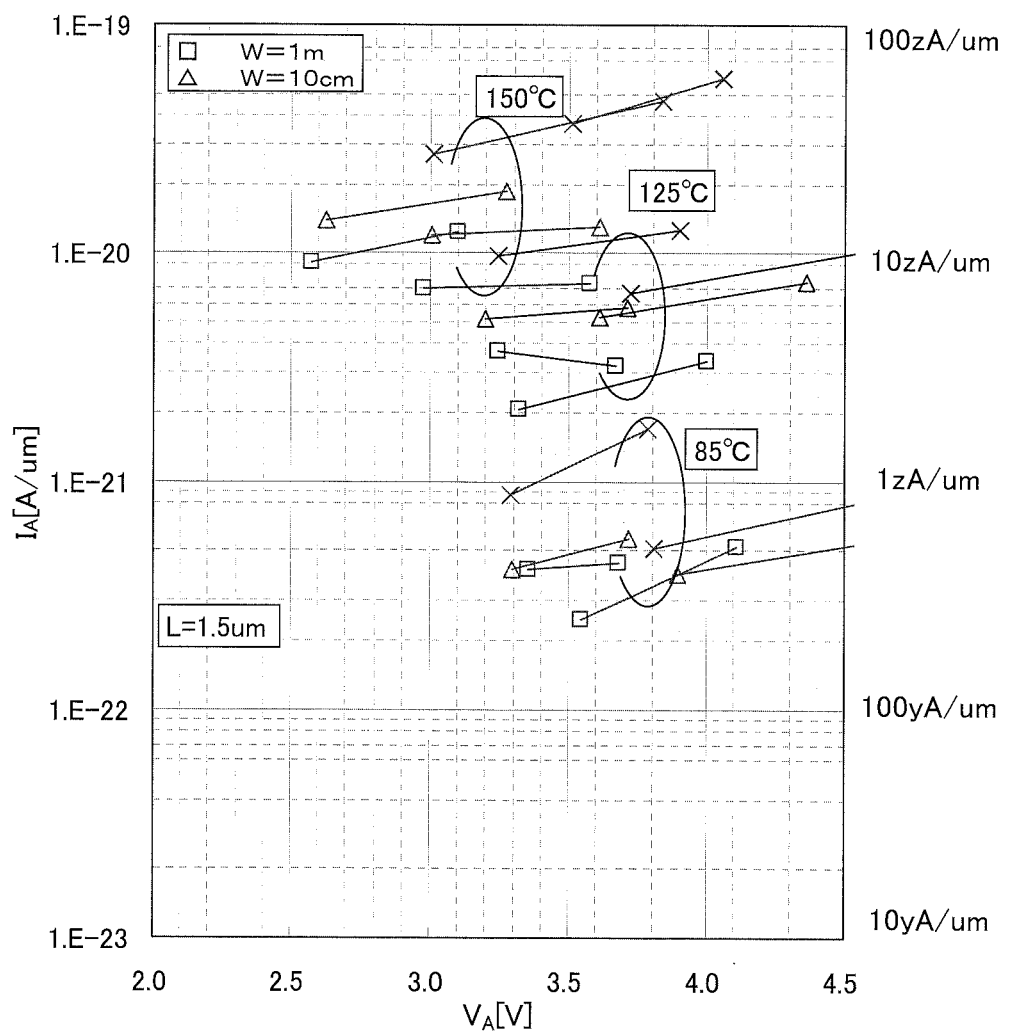
FIG. 9 illustrates characteristics of a transistor.

FIG. 7, FIG. 8, and FIG. 9 each show the relation between the voltage of the node A in SMP1 to SMP6 at 85° C., 125° C., and 150° C. and the leakage current estimated by the above measurement. As shown in FIG. 7, FIG. 8, and FIG. 9, the leakage current is 100 zA/μm or lower even at 150° C.

As described above, the leakage current is sufficiently low in the circuit for evaluating characteristics, including the transistor whose channel region includes an oxide semiconductor, which means that the off-state current of the transistor is sufficiently low. In addition, the off-state current of the transistor is sufficiently low even when the temperature rises.

<Characteristics of Transistor with Channel Region Including Oxide Semiconductor>

A transistor in which an oxide semiconductor including In, Sn, and Zn as main components is used as a channel region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 23A:
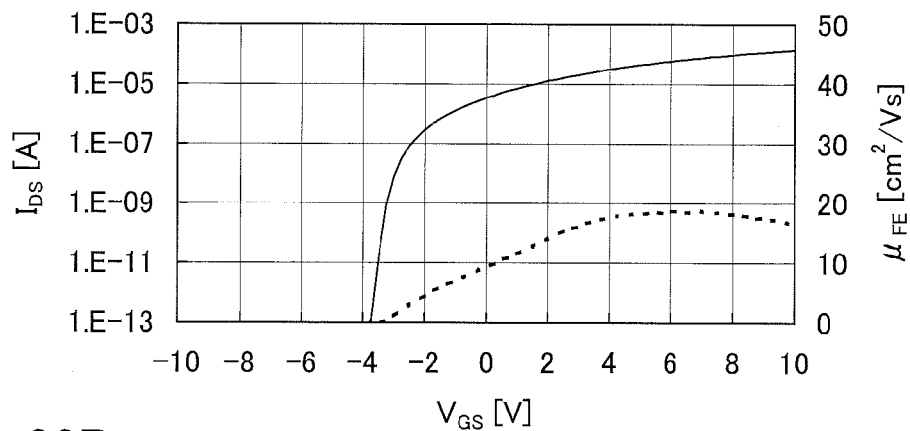
FIGS. 23A to 23C are graphs each illustrating characteristics of a transistor including an oxide semiconductor film.
Figure 23B:
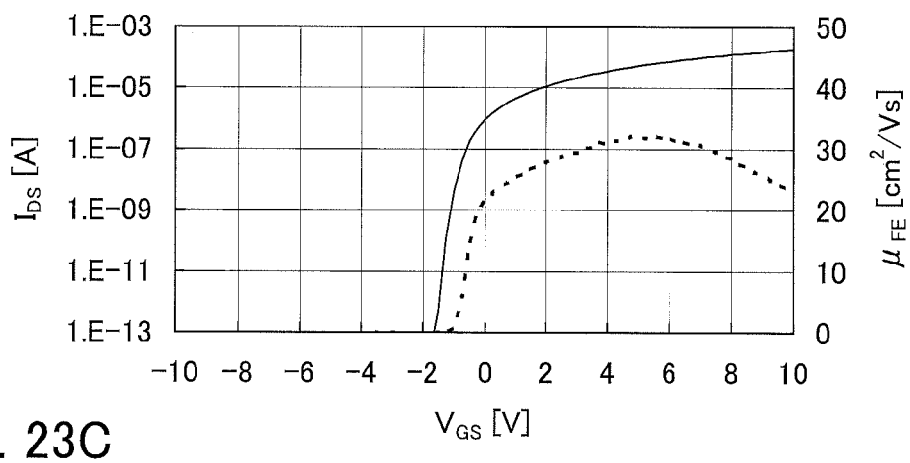
Figure 23C:
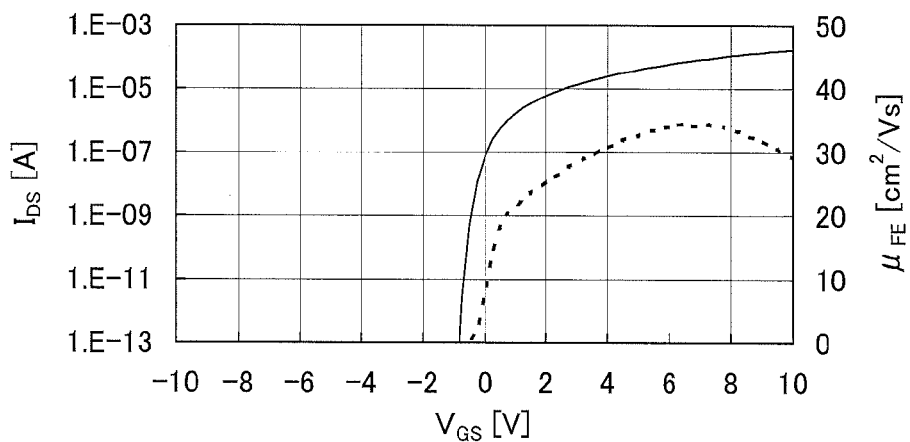

As an example, FIGS. 23A to 23C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 23A shows characteristics of a transistor whose oxide semiconductor film including In, Sn, and Zn as main components was formed by sputtering without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 23B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 23C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating layer was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating layer was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 24A:
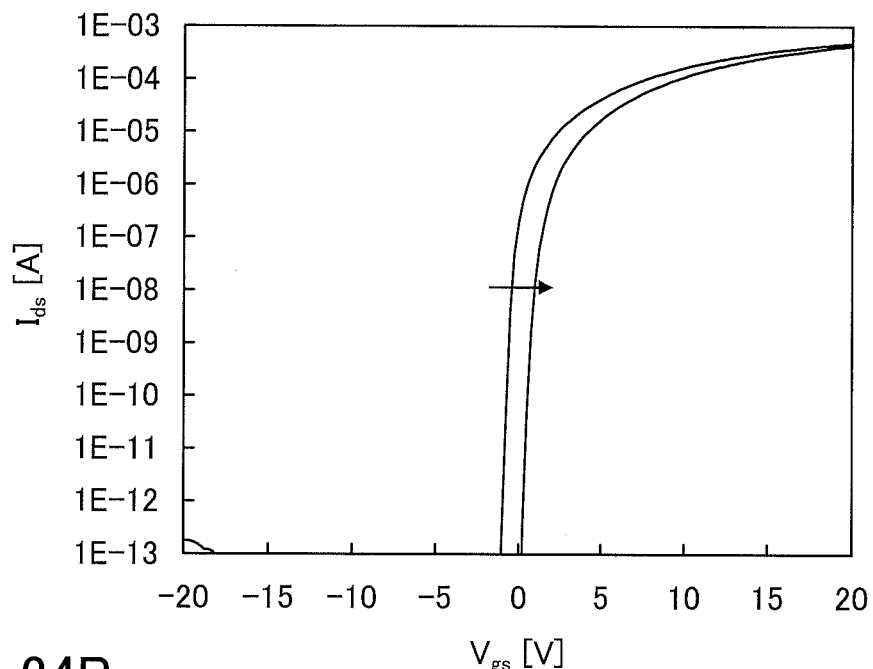
FIGS. 24A and 24B illustrate $V_g$-$I_d$ characteristics after BT tests of a transistor of Sample 1.
Figure 24B:
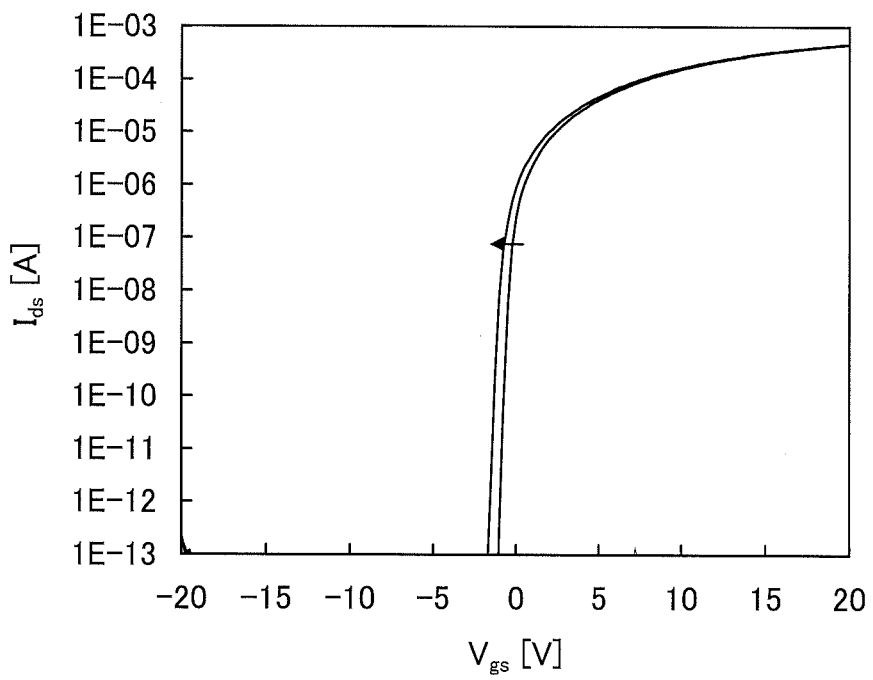
Figure 25A:
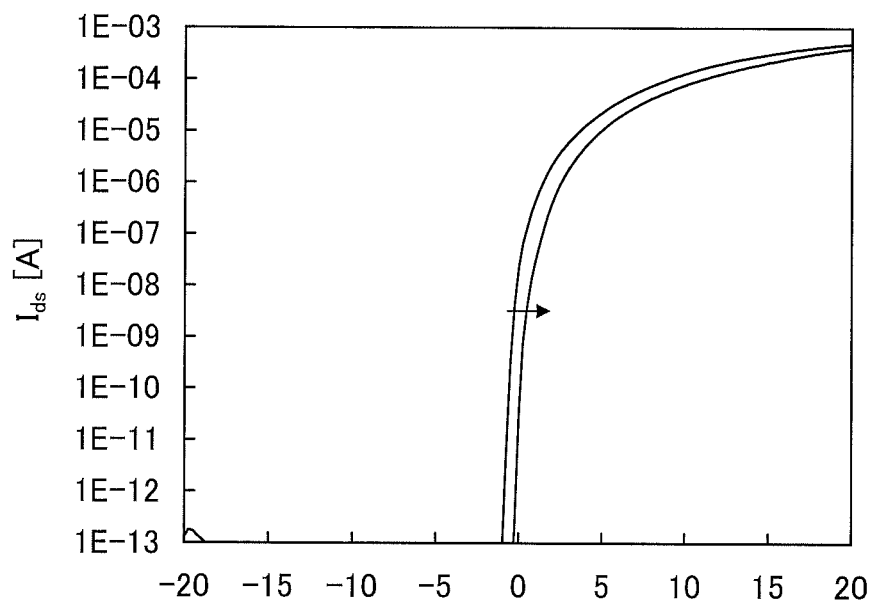
FIGS. 25A and 25B illustrate $V_g$-$I_d$ characteristics after a BT test of a transistor of Sample 2.
Figure 25B:
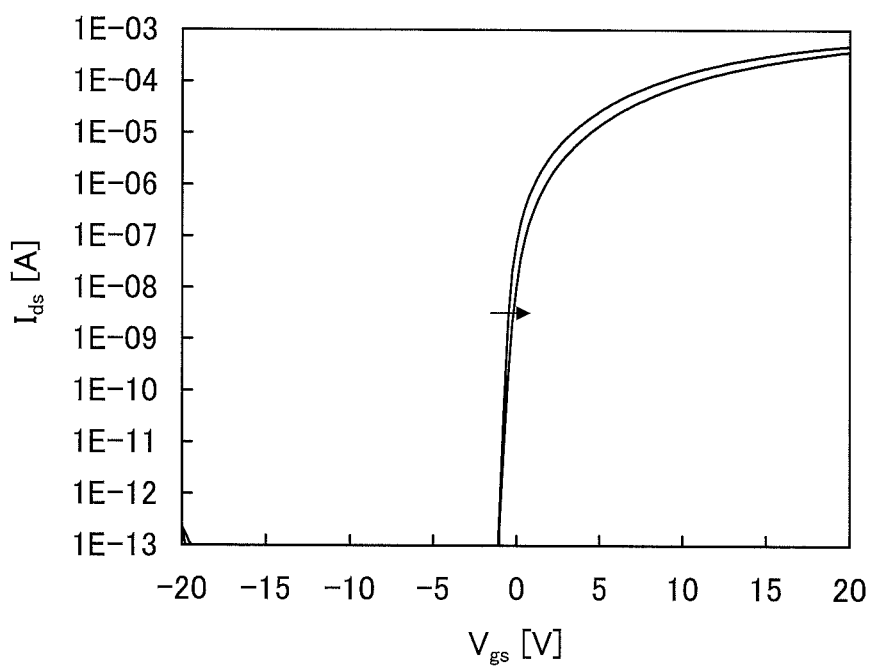

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for fabricating Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample fabricated in this manner was used as Sample A.

Next, a sample fabricated by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample fabricated in this manner was used as Sample B.

Figure 26:
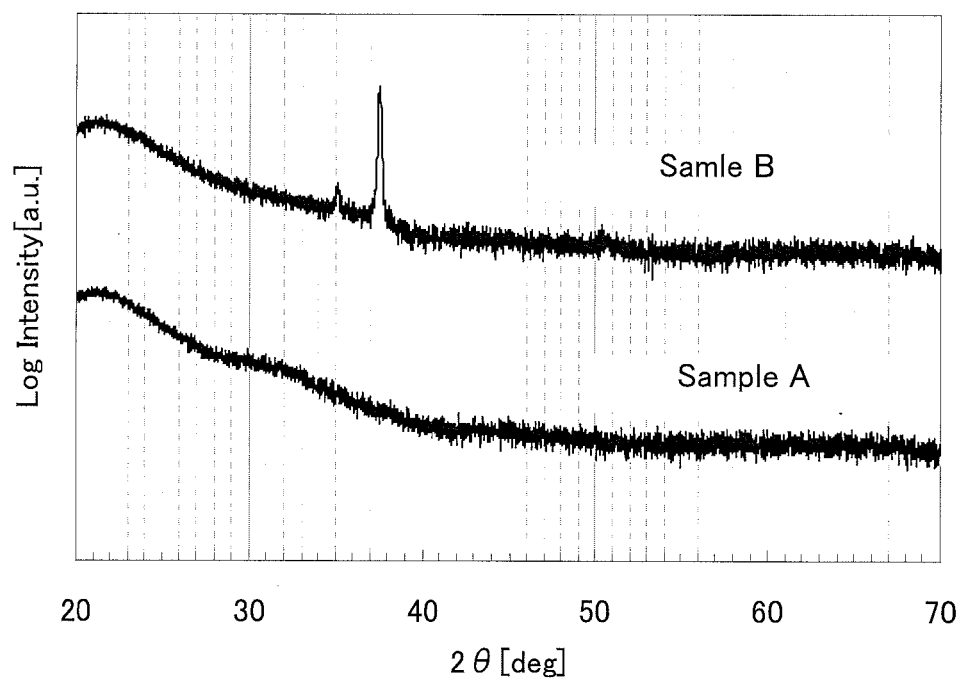
FIG. 26 illustrates XRD spectra of Sample A and Sample B.

FIG. 26 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 27:
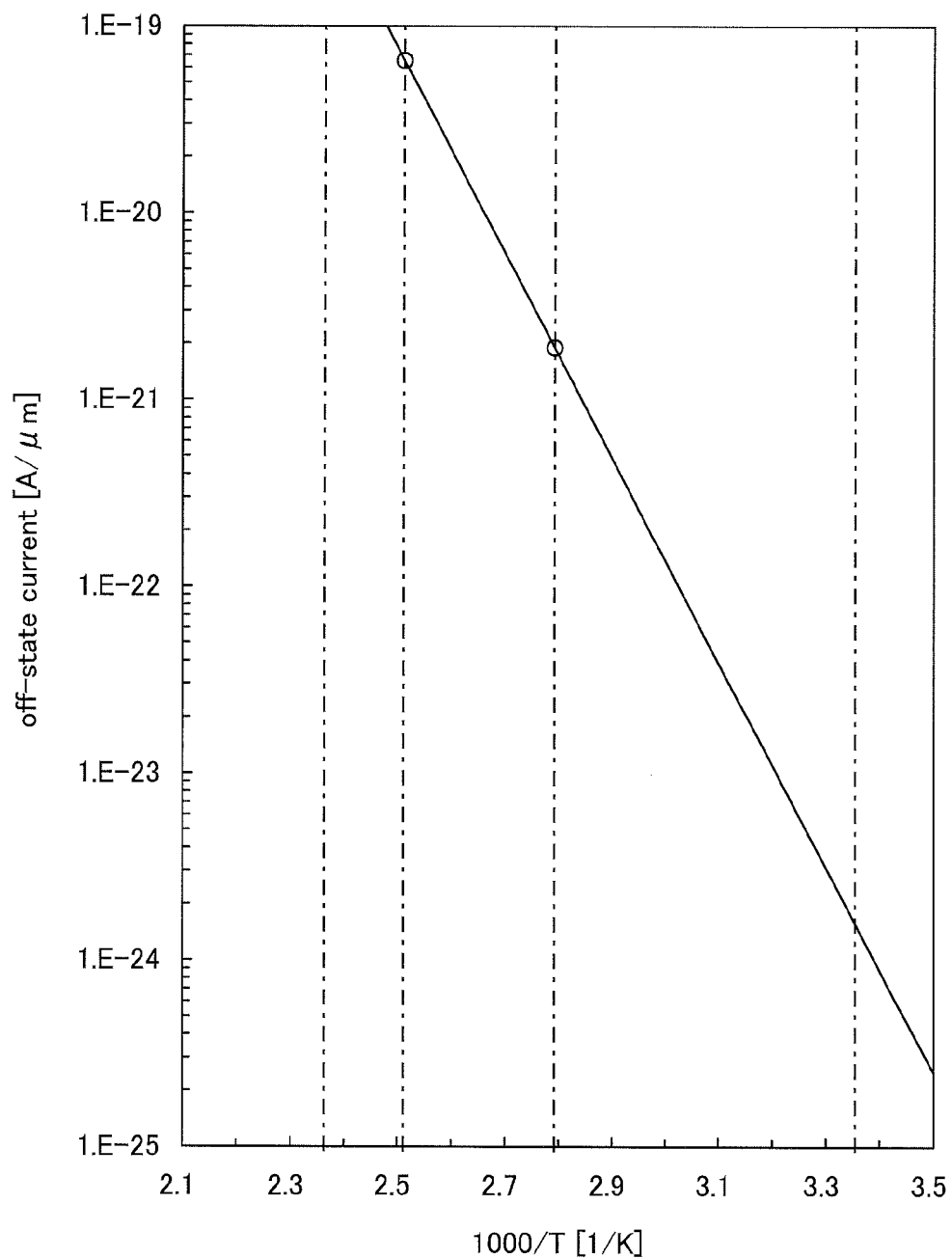
FIG. 27 illustrates a relation between the off-state current of a transistor and the substrate temperature in measurement.

FIG. 27 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 27, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 28:
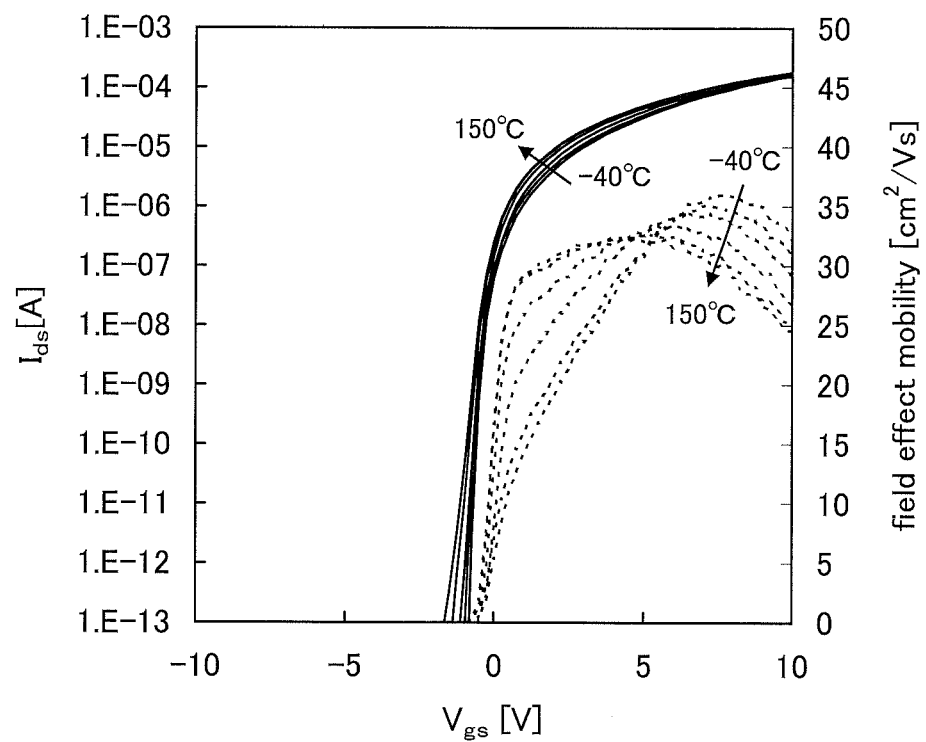
FIG. 28 is a graph showing $V_g$ dependence of $I_d$ and field effect mobility.
Figure 29A:
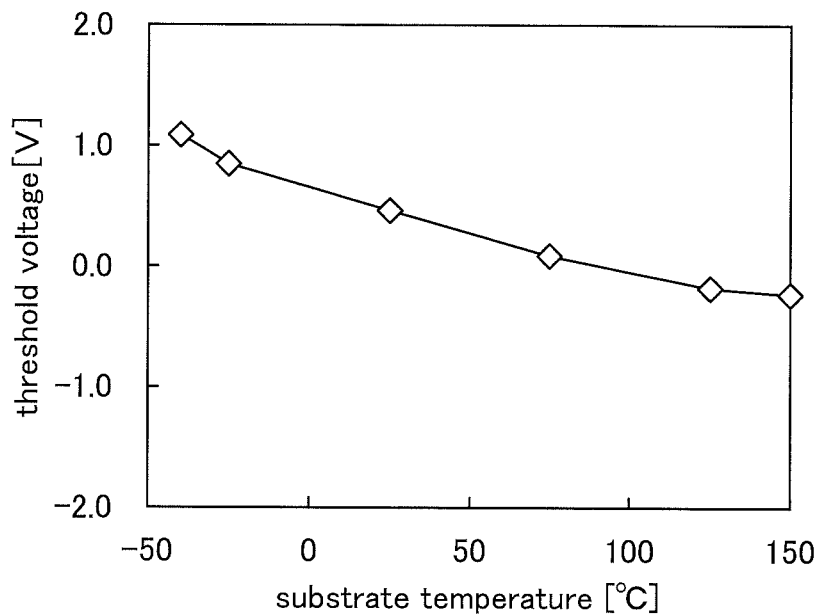
FIG. 29A illustrates a relation between substrate temperature and threshold voltage.

FIG. 28 shows the $V_g$ dependence of $I_d$ (a solid line) and field-effect mobility (a dotted line). FIG. 29A shows a relation between the substrate temperature and the threshold voltage, and FIG. 29B shows a relation between the substrate temperature and the field-effect mobility.

From FIG. 29A, it is found that the threshold voltage gets lower as the substrate temperature increases. Note that the threshold voltage is decreased from 1.09 V to −0.23 V in the range from −40° C. to 150° C.

Figure 29B:
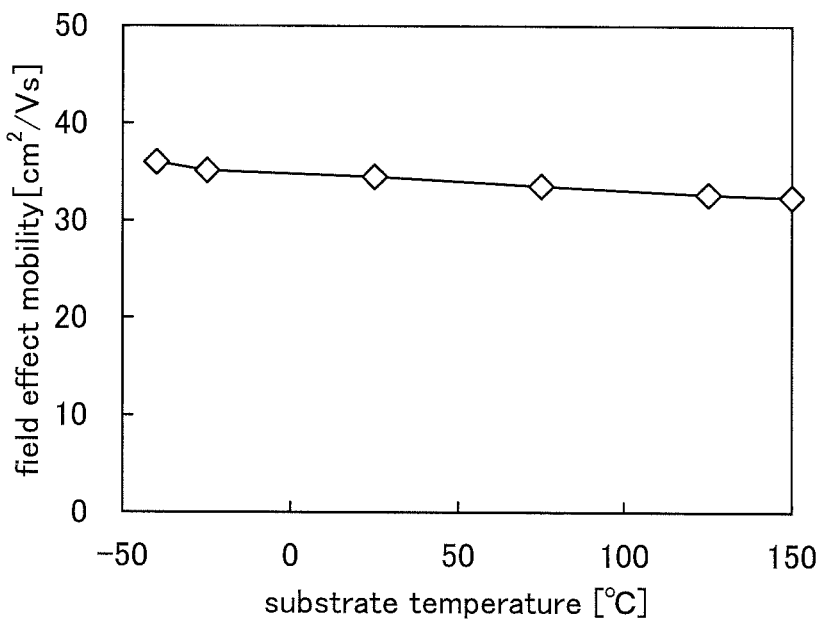
FIG. 29B illustrates a relation between substrate temperature and field effect mobility.

From FIG. 29B, it is found that the field-effect mobility gets lower as the substrate temperature increases. Note that the field-effect mobility is decreased from 36 $cm^2/Vs$ to 32 $cm^2/Vs$ in the range from −40° C. to 150° C. Thus, it is found that variation in electric characteristics is small in the above temperature range.

In a transistor in which such an oxide semiconductor including In, Sn, and Zn as main components is used as a channel region, a field-effect mobility of 30 $cm^2/Vsec$ or higher, preferably 40 $cm^2/Vsec$ or higher, further preferably 60 $cm^2/Vsec$ or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Fabrication Example 1

In this fabrication example, an example of a transistor in which an In—Sn—Zn—O film is used as an oxide semiconductor film will be described with reference to FIGS. 30A and 30B and the like.

Figure 30A:
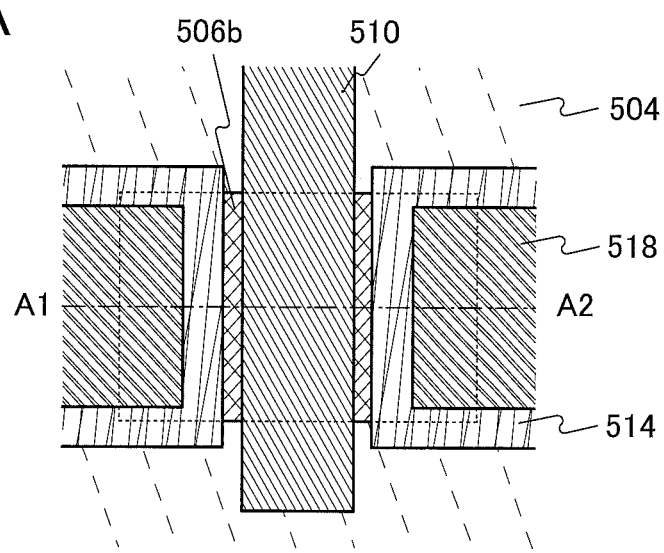
FIG. 30A is a top view of a semiconductor device and FIG. 30B is a cross-sectional view thereof.
Figure 30B:
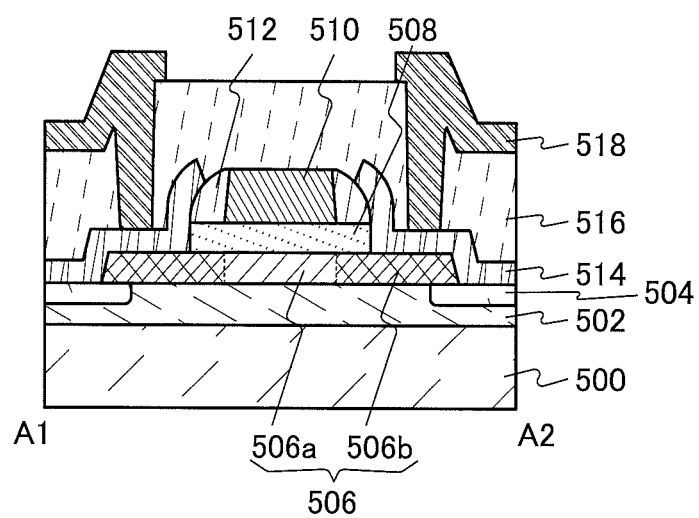

FIGS. 30A and 30B are a top view and a cross-sectional view of a coplanar transistor having a top-gate top-contact structure. FIG. 30A is the top view of the transistor. FIG. 30B illustrates a cross-sectional view along dashed-dotted line A1-A2 in FIG. 30A.

The transistor illustrated in FIG. 30B includes a substrate 500; a base insulating layer 502 provided over the substrate 500; a protective insulating layer 504 provided in the periphery of the base insulating layer 502; an oxide semiconductor film 506 provided over the base insulating layer 502 and the protective insulating layer 504 and including a high-resistance region 506a and low-resistance regions 506b; a gate insulating layer 508 provided over the oxide semiconductor film 506; a gate electrode 510 provided to overlap with the oxide semiconductor film 506 with the gate insulating layer 508 positioned therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not illustrated, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

Fabrication Example 2

In this fabrication example, another example of a transistor in which an In—Sn—Zn—O film is used as an oxide semiconductor film will be described.

Figure 31A:
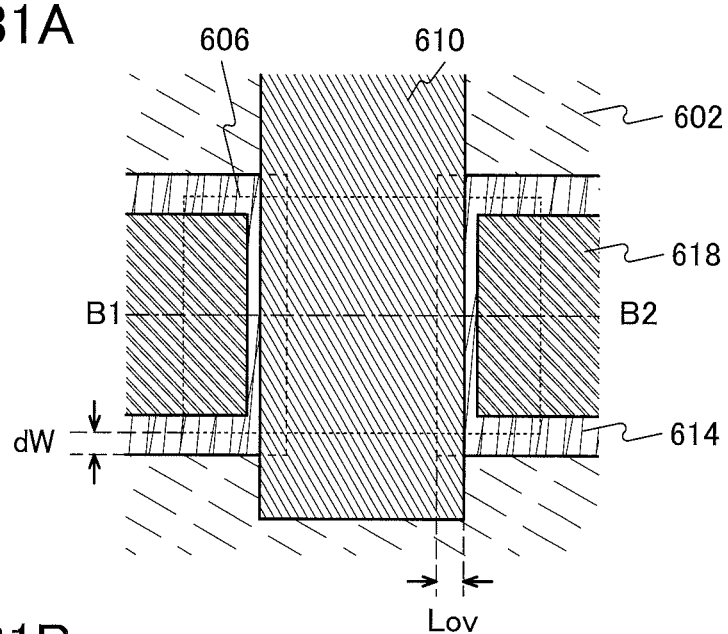
FIG. 31A is a top view of a semiconductor device and FIG. 31B is a cross-sectional view thereof.
Figure 31B:
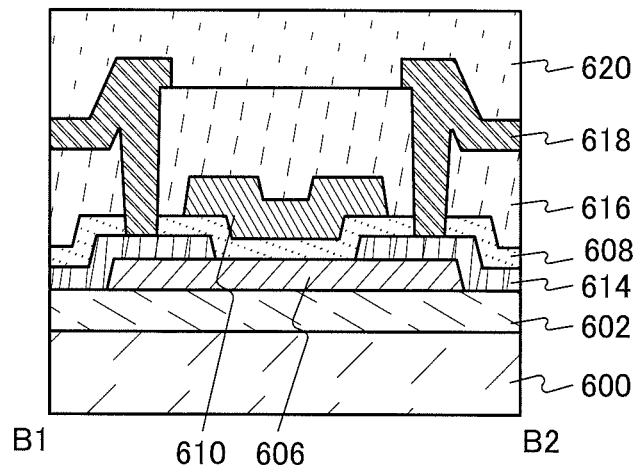

FIGS. 31A and 31B are a top view and a cross-sectional view which illustrate a structure of a transistor fabricated in this embodiment. FIG. 31A is the top view of the transistor. FIG. 31B is a cross-sectional view along dashed-dotted line B1-B2 in FIG. 31A.

The transistor illustrated in FIG. 31B includes a substrate 600; a base insulating layer 602 provided over the substrate 600; an oxide semiconductor film 506 provided over the base insulating layer 602; a pair of electrodes 614 in contact with the oxide semiconductor film 506; a gate insulating layer 608 provided over the oxide semiconductor film 506 and the pair of electrodes 614; a gate electrode 610 provided to overlap with the oxide semiconductor film 506 with the gate insulating layer 608 positioned therebetween; an interlayer insulating film 516 provided to cover the gate insulating layer 608 and the gate electrode 610; wirings 618 connected to the pair of electrodes 614 through openings formed in the interlayer insulating film 516; and a protective film 520 provided to cover the interlayer insulating film 516 and the wirings 618.

As the substrate 600, a glass substrate can be used. As the base insulating layer 602, a silicon oxide film can be used. As the oxide semiconductor film 506, an In—Sn—Zn—O film can be used. As the pair of electrodes 614, a tungsten film can be used. As the gate insulating layer 608, a silicon oxide film can be used. The gate electrode 610 can have a layered structure of a tantalum nitride film and a tungsten film. The interlayer insulating film 516 can have a layered structure of a silicon oxynitride film and a polyimide film. The wirings 618 can each have a layered structure in which a titanium film, an aluminum film, and a titanium film are formed in this order. As the protective film 520, a polyimide film can be used.

Note that in the transistor having the structure illustrated in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor film 506, is referred to as dW.

Example 1

In Example 1, a result of evaluating data storage characteristics of a memory element including a transistor whose channel region is formed using an oxide semiconductor will be described. Note that a circuit in FIG. 10 is fabricated for the evaluation.

Figure 10:
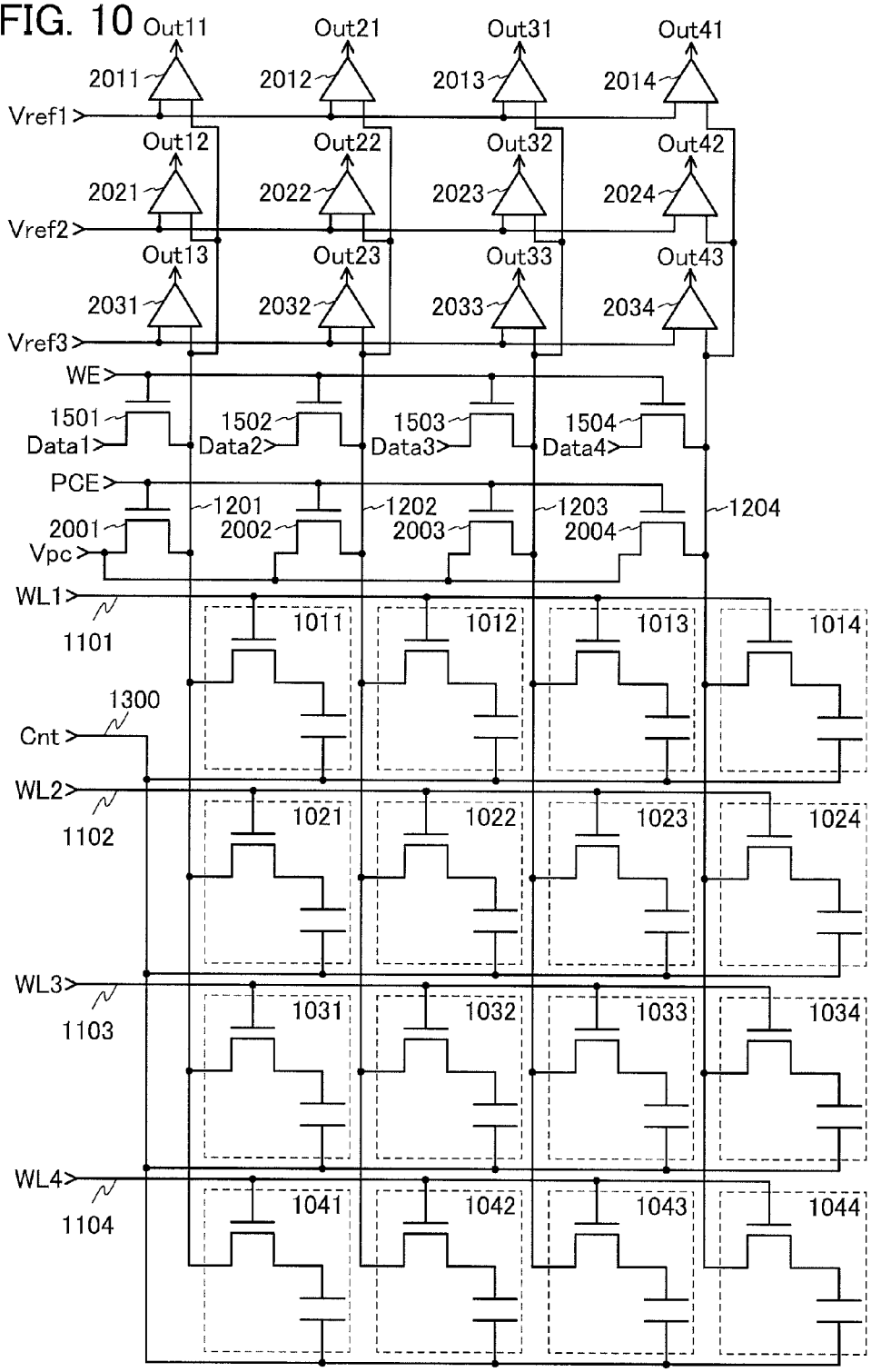
FIG. 10 is a circuit diagram for measurement in Example 1.

Specifically, the circuit in FIG. 10 includes the same configuration as that of the memory element 10 in FIG. 1A. The circuit in FIG. 10 includes memory elements 1011 to 1014, 1021 to 1024, 1031 to 1034, and 1041 to 1044, which are provided in four rows and four columns; word lines 1101 to 1104; bit lines 1201 to 1204; a wiring 1300; transistors 1501 to 1504; transistors 2001 to 2004; comparators 2011 to 2014; comparators 2021 to 2024; and comparators 2031 to 2034. The word lines 1101 to 1104 are electrically connected to gates of transistors included in four memory elements provided in any row. The bit lines 1201 to 1204 are electrically connected to ones of sources and drains of transistors included in four memory elements provided in any column. The wiring 1300 supplies a fixed potential (Cnt) and is electrically connected to the other electrodes of capacitors included in memory elements provided in four rows and four columns. A gate of the transistor 1501 is electrically connected to a wiring supplying a write enable signal (WE), one of a source and a drain of the transistor 1501 is electrically connected to a wiring supplying a data signal (Data1), and the other of the source and the drain of the transistor 1501 is electrically connected to the bit line 1201. A gate of the transistor 1502 is electrically connected to the wiring supplying the write enable signal (WE), one of a source and a drain of the transistor 1502 is electrically connected to a wiring supplying a data signal (Data2), and the other of the source and the drain of the transistor 1502 is electrically connected to the bit line 1202. A gate of the transistor 1503 is electrically connected to the wiring supplying the write enable signal (WE), one of a source and a drain of the transistor 1503 is electrically connected to a wiring supplying a data signal (Data3), and the other of the source and the drain of the transistor 1503 is electrically connected to the bit line 1203. A gate of the transistor 1504 is electrically connected to the wiring supplying the write enable signal (WE), one of a source and a drain of the transistor 1504 is electrically connected to a wiring supplying a data signal (Data4), and the other of the source and the drain of the transistor 1504 is electrically connected to the bit line 1204. A gate of the transistor 2001 is electrically connected to a wiring supplying a precharge signal (PCE), one of a source and a drain of the transistor 2001 is electrically connected to a wiring supplying a precharge voltage (Vpc), and the other of the source and the drain of the transistor 2001 is electrically connected to the bit line 1201. A gate of the transistor 2002 is electrically connected to the wiring supplying a precharge signal (PCE), one of a source and a drain of the transistor 2002 is electrically connected to the wiring supplying a precharge voltage (Vpc), and the other of the source and the drain of the transistor 2002 is electrically connected to the bit line 1202. A gate of the transistor 2003 is electrically connected to the wiring supplying a precharge signal (PCE), one of a source and a drain of the transistor 2003 is electrically connected to the wiring supplying a precharge voltage (Vpc), and the other of the source and the drain of the transistor 2003 is electrically connected to the bit line 1203. A gate of the transistor 2004 is electrically connected to the wiring supplying a precharge signal (PCE), one of a source and a drain of the transistor 2004 is electrically connected to the wiring supplying a precharge voltage (Vpc), and the other of the source and the drain of the transistor 2004 is electrically connected to the bit line 1204. A first input terminal of the comparator 2011 is electrically connected to a wiring supplying a first reference voltage (Vref1) and a second input terminal of the comparator 2011 is electrically connected to the bit line 1201. A first input terminal of the comparator 2012 is electrically connected to the wiring supplying the first reference voltage (Vref1) and a second input terminal of the comparator 2012 is electrically connected to the bit line 1202. A first input terminal of the comparator 2013 is electrically connected to the wiring supplying the first reference voltage (Vref1) and a second input terminal of the comparator 2013 is electrically connected to the bit line 1203. A first input terminal of the comparator 2014 is electrically connected to the wiring supplying the first reference voltage (Vref1) and a second input terminal of the comparator 2014 is electrically connected to the bit line 1204. A first input terminal of the comparator 2021 is electrically connected to a wiring supplying a second reference voltage (Vref2) and a second input terminal of the comparator 2021 is electrically connected to the bit line 1201. A first input terminal of the comparator 2022 is electrically connected to the wiring supplying the second reference voltage (Vref2) and a second input terminal of the comparator 2022 is electrically connected to the bit line 1202. A first input terminal of the comparator 2023 is electrically connected to the wiring supplying the second reference voltage (Vref2) and a second input terminal of the comparator 2023 is electrically connected to the bit line 1203. A first input terminal of the comparator 2024 is electrically connected to the wiring supplying the second reference voltage (Vref2) and a second input terminal of the comparator 2024 is electrically connected to the bit line 1204. A first input terminal of the comparator 2031 is electrically connected to a wiring supplying a third reference voltage (Vref3) and a second input terminal of the comparator 2031 is electrically connected to the bit line 1201. A first input terminal of the comparator 2032 is electrically connected to the wiring supplying the third reference voltage (Vref3) and a second input terminal of the comparator 2032 is electrically connected to the bit line 1202. A first input terminal of the comparator 2033 is electrically connected to the wiring supplying the third reference voltage (Vref3) and a second input terminal of the comparator 2033 is electrically connected to the bit line 1203. A first input terminal of the comparator 2034 is electrically connected to the wiring supplying the third reference voltage (Vref3) and a second input terminal of the comparator 2034 is electrically connected to the bit line 1204.

Figure 11A:
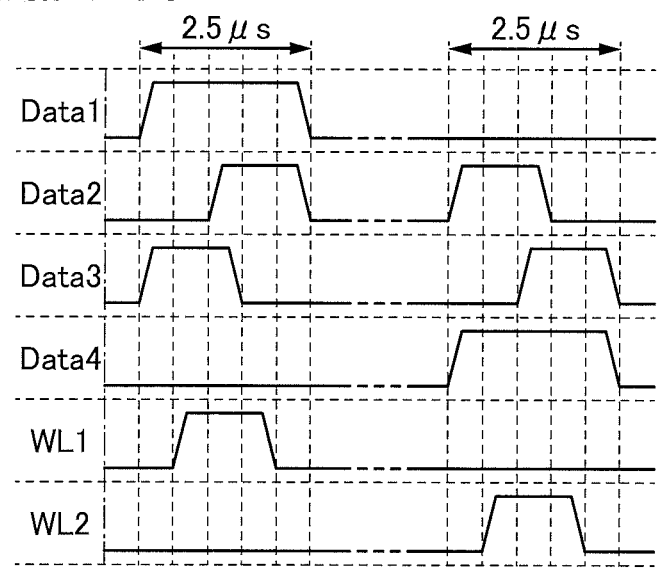
FIG. 11A illustrates a writing operation in Example 1 and FIG. 11B illustrates a reading operation in Example 1.
Figure 11B:
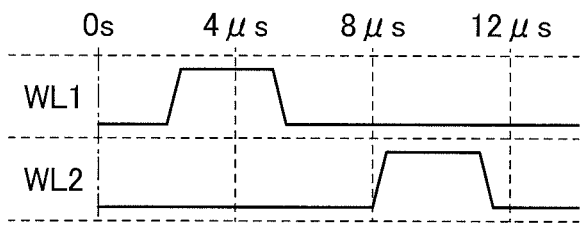

FIG. 11A illustrates a data writing operation performed on the circuit in FIG. 10. Note that in FIGS. 11A and 11B show change in the potentials of data signals (Data1 to Data4), the potential (WL1) of the word line 1101, and the potential (WL2) of the word line 1102. In short, in Example 1, the data writing operation in FIG. 1B is performed on the memory elements 1011 and 1024, the data writing operation in FIG. 1C is performed on the memory elements 1012 and 1023, the data writing operation in FIG. 1D is performed on the memory elements 1013 and 1022, and the data writing operation in FIG. 1E is performed on the memory elements 1014 and 1021. Further, FIG. 11B shows change in the potential (WL1) of the word line 1101 and the potential (WL2) of the word line 1102 in the case of a reading operation performed after the writing operation. Note that in FIG. 11B, a period in which the potential (WL1) of the word line 1101 is at the high level is a period of reading data stored in the memory elements 1011 to 1014, and a period in which the potential (WL2) of the word line 1102 is at the high level is a period of reading data stored in the memory elements 1021 to 1024.

Figure 12:
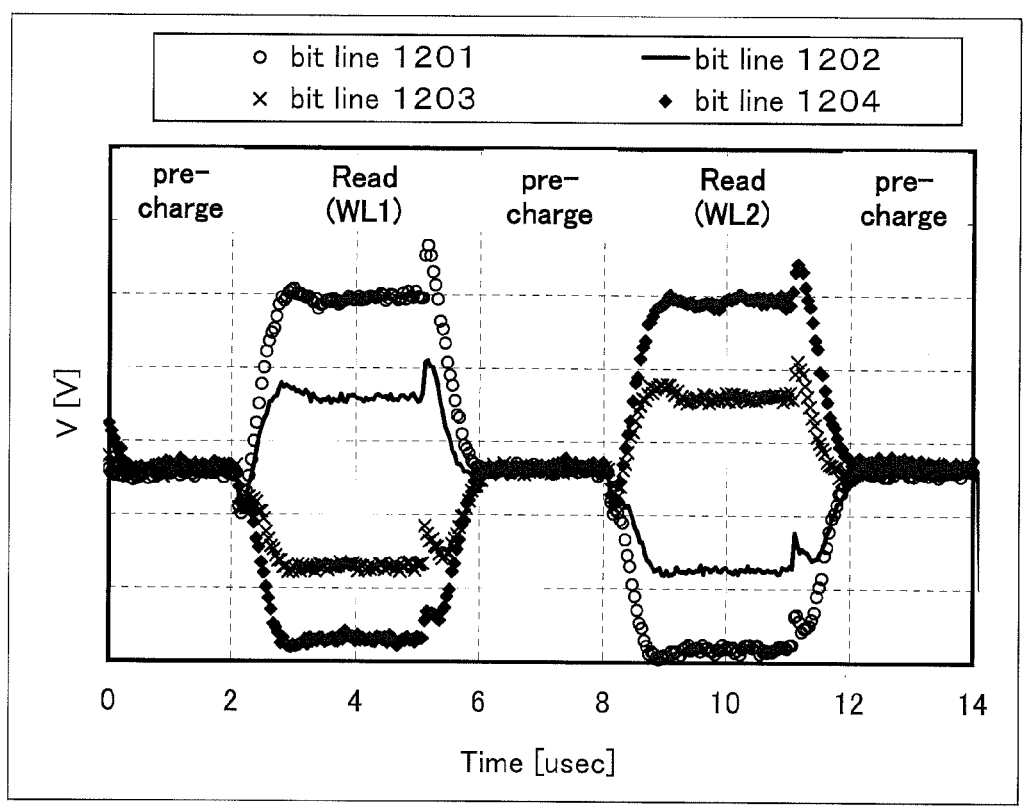
FIG. 12 illustrates measurement results of Example 1.

FIG. 12 shows a result of measuring the potentials of the bit lines 1201 to 1204 in the reading operation in FIG. 11B. Note that the bit lines 1201 to 1204 are precharged before data is read from the memory elements 1011 to 1014 and 1021 to 1024.

Specifically, FIG. 12 shows data in which the potential of the bit line 1201 is stored in the memory element 1011, data in which the potential of the bit line 1202 is stored in the memory element 1012, data in which the potential of the bit line 1203 is stored in the memory element 1013, and data in which the potential of the bit line 1204 is stored in the memory element 1014, in a period (Read(WL1)) in which the potential of the word line 1101 is at the high level. Similarly, FIG. 12 shows data in which the potential of the bit line 1201 is stored in the memory element 1021, data in which the potential of the bit line 1202 is stored in the memory element 1022, data in which the potential of the bit line 1203 is stored in the memory element 1023, and data in which the potential of the bit line 1204 is stored in the memory element 1024, in a period (Read(WL2)) in which the potential of the word line 1102 is at the high level.

From FIG. 12, the amount of charge stored in a memory element can be controlled by the writing operation in FIG. 11A so as to have a plurality of stages. That is to say, it is possible to obtain the memory element storing multilevel data by the writing operation in FIG. 11A.

Figure 13A:
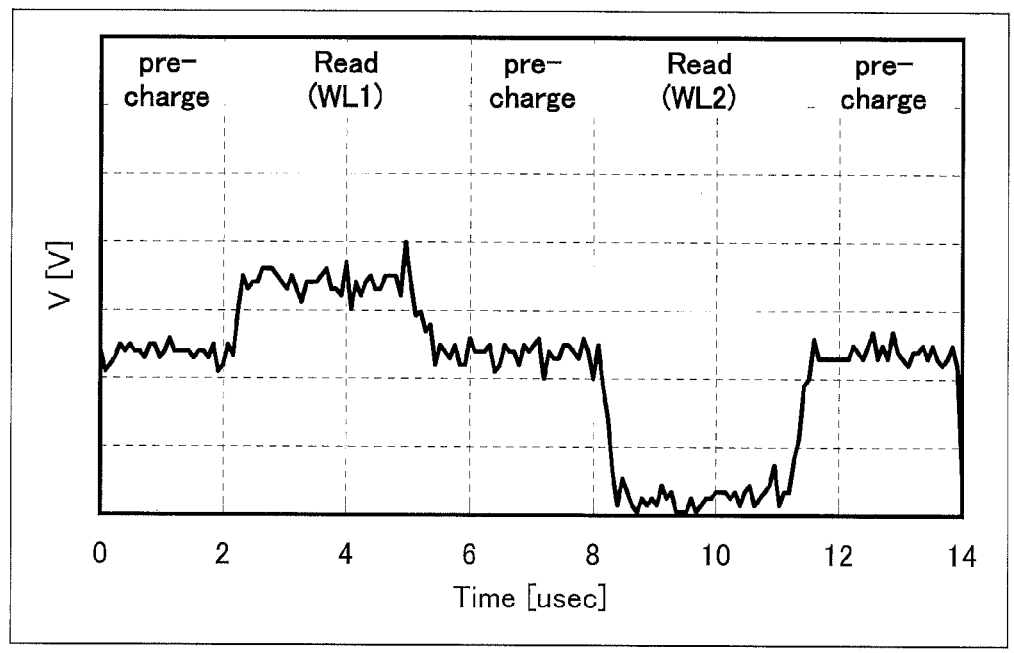
FIGS. 13A and 13B illustrate measurement results of Example 1.
Figure 13B:
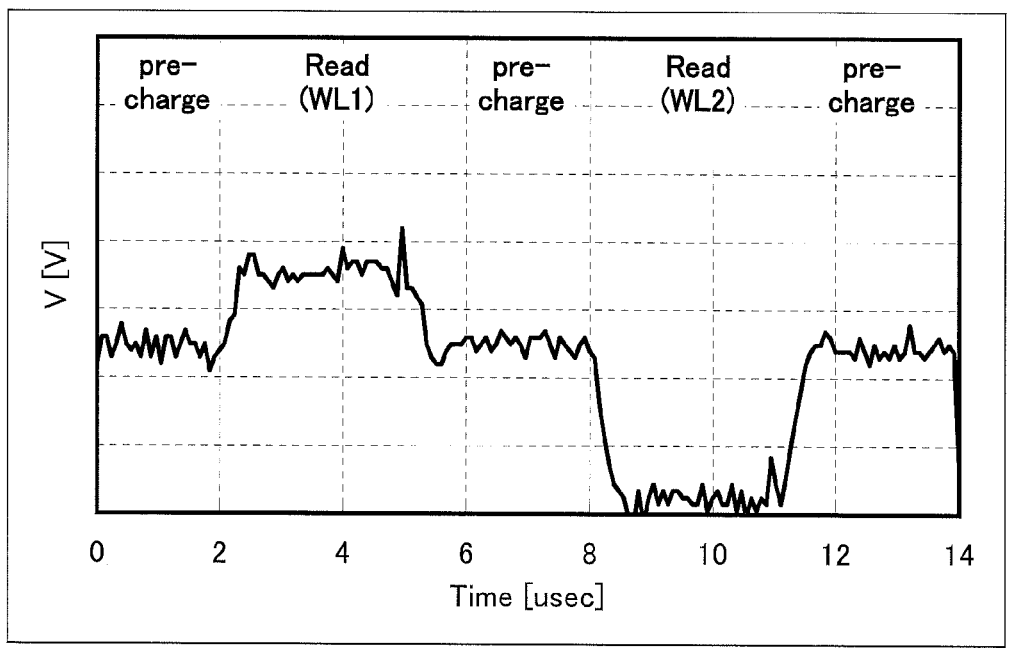

FIGS. 13A and 13B show a result of measuring the potential of the bit line in the case where data reading operations are performed after the data writing operation in FIG. 1C is performed on the memory element electrically connected to the word line 1101 and the data writing operation in FIG. 1E is performed on the memory element electrically connected to the word line 1102. Note that both the former memory element and the latter memory element are electrically connected to the same bit line. FIG. 13A shows a measurement result of the potential of the bit line at the time of the reading operation, measured after 120 milliseconds pass from the termination of the writing operation. FIG. 13B shows a measurement result of the potential of the bit line at the time of the reading operation, measured after 120 minutes (2 hours) pass from the termination of the writing operation.

As shown in FIGS. 13A and 13B, in the memory element fabricated in Example 1, the potential of the bit line at the time of the reading operation is little changed even in the case of a long storage time. That is to say, the memory element can accurately store data even in the case of a long storage time.

Example 2

In Example 2, a specific example of a semiconductor device including the memory element will be described.

Figure 14A:
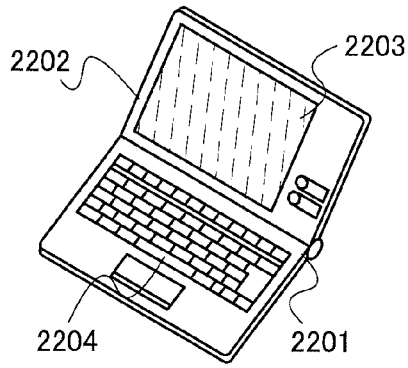
FIGS. 14A to 14F each illustrate a specific example of a semiconductor device.

FIG. 14A illustrates a laptop computer, which includes a main body 2201, a housing 2202, a display portion 2203, a keyboard 2204, and the like. Note that the main body 2201 includes a memory device provided with the memory element disclosed in this specification.

Figure 14B:
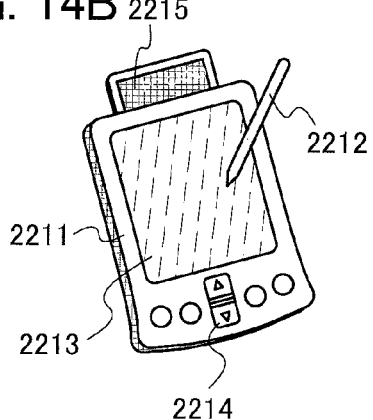

FIG. 14B illustrates a personal digital assistant (PDA), which includes a main body 2211 having a display portion 2213, an external interface 2215, an operation button 2214, and the like. A stylus 2212 for operation is included as an accessory. Note that the main body 2211 includes a memory device provided with a memory element disclosed this specification.

Figure 14C:
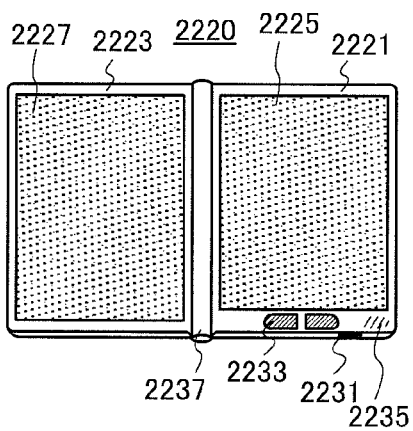

FIG. 14C illustrates an e-book reader 2220 as an example of electronic paper. The e-book reader 2220 includes two housings: housings 2221 and 2223. The housings 2221 and 2223 are bound with each other by an axis portion 2237, along which the e-book reader 2220 can be opened and closed. With such a structure, the e-book reader 2220 can be used as paper books. Note that a memory device provided with a memory element disclosed this specification is provided in one of the housing 2221, the housing 2223, and the axis portion 2237.

A display portion 2225 is incorporated in the housing 2221, and a display portion 2227 is incorporated in the housing 2223. The display portion 2225 and the display portion 2227 may display one image or different images. In the structure where the display portions display different images from each other, for example, the right display portion (the display portion 2225 in FIG. 14C) can display text and the left display portion (the display portion 2227 in FIG. 14C) can display images.

Further, in FIG. 14C, the housing 2221 is provided with an operation portion and the like. For example, the housing 2221 is provided with a power button 2231, an operation key 2233, a speaker 2235, and the like. With the operation key 2233, pages can be turned. Note that a keyboard, a pointing device, or the like may also be provided on the surface of the housing, on which the display portion is provided. Furthermore, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an electronic book server.

Figure 14D:
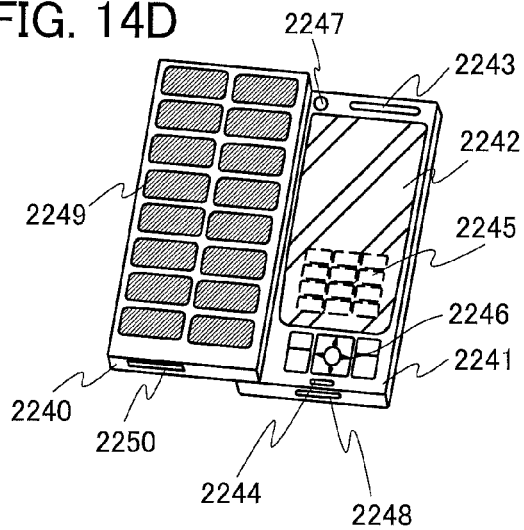

FIG. 14D illustrates a mobile phone. The mobile phone includes two housings: housings 2240 and 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 charging of the mobile phone, an external memory slot 2250, and the like. An antenna is incorporated in the housing 2241. Note that a memory device provided with a memory element disclosed this specification is provided in the housing 2240 and the housing 2241.

The display panel 2242 has a touch panel function. A plurality of operation keys 2245 which are displayed as images is illustrated by dashed lines in FIG. 14D. Note that the mobile phone includes a booster circuit for increasing a voltage output from the solar cell 2249 to a voltage needed for each circuit. Moreover, the mobile phone can include a contactless IC chip, a small recording device, or the like in addition to the above structure.

The display orientation of the display panel 2242 appropriately changes in accordance with the application mode. Further, the camera lens 2247 is provided on the same surface as the display panel 2242, and thus it can be used as a video phone. The speaker 2243 and the microphone 2244 can be used for videophone calls, recording, and playing sound, etc. as well as voice calls. Moreover, the housings 2240 and 2241 in a state where they are developed as illustrated in FIG. 14D can be slid so that one is lapped over the other; therefore, the size of the portable phone can be reduced, which makes the portable phone suitable for being carried.

The external connection terminal 2248 can be connected to an AC adapter or a variety of cables such as a USB cable, which enables charging of the mobile phone and data communication between the mobile phone or the like. Moreover, a larger amount of data can be saved and moved by inserting a recording medium to the external memory slot 2250. Further, in addition to the above functions, an infrared communication function, a television reception function, or the like may be provided.

Figure 14E:
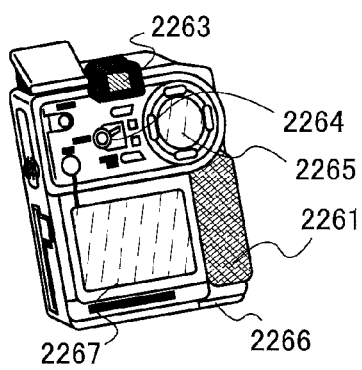

FIG. 14E illustrates a digital camera, which includes a main body 2261, a display portion (A) 2267, an eyepiece 2263, an operation switch 2264, a display portion (B) 2265, a battery 2266, and the like. Note that the main body 2261 includes a memory device provided with a memory element disclosed this specification.

Figure 14F:
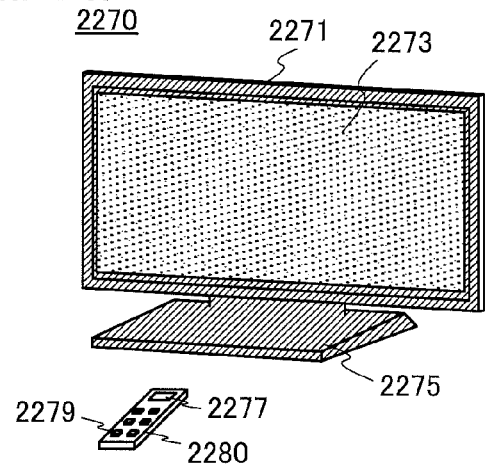

FIG. 14F illustrates a television set. In a television set 2270, a display portion 2273 is incorporated in a housing 2271. The display portion 2273 can display images. Here, the housing 2271 is supported by a stand 2275. Note that in the housing 2271, a memory device provided with a memory element disclosed this specification is provided.

The television set 2270 can be operated by an operation switch of the housing 2271 or a separate remote controller 2280. Channels and volume can be controlled with an operation key 2279 of the remote controller 2280 so that an image displayed on the display portion 2273 can be controlled. Moreover, the remote controller 2280 may have a display portion 2277 in which the data outgoing from the remote controller 2280 is displayed.

Note that the television set 2270 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

EXPLANATION OF REFERENCE

10: memory element; 11: word line; 12: bit line; 13: wiring; 20: reading circuit; 50: substrate; 51: base layer; 52: gate layer; 53: gate insulating layer; 54: oxide semiconductor layer; 55a: source layer; 55b: drain layer; 56: protective insulating layer; 57: planarization insulating layer; 58a: conductive layer; 58b: conductive layer; 101: transistor; 102: capacitor; 200: transistor; 201 to 203: comparator; 301: base insulating layer; 302: embedded insulator; 303a: semiconductor region; 303b: semiconductor region; 303c: semiconductor region; 304: gate insulating layer; 305: gate; 306a: sidewall insulator; 306b: sidewall insulator; 307: insulator; 308a: source; 308b: drain; 500: substrate; 502: base insulating layer; 504: protective insulating layer; 506: oxide semiconductor film; 506a: high-resistance region; 506b: low-resistance region; 508: gate insulating layer; 510: gate electrode; 512: sidewall insulating film; 514: electrode; 516: interlayer insulating film; 518: wiring; 600: substrate; 602: base insulating layer; 606: oxide semiconductor film; 608: gate insulating layer; 610: gate electrode; 614: electrode; 616: interlayer insulating film; 618: wiring; 620: protective film; 801: measurement system; 811: transistor; 812: transistor; 813: capacitor; 814: transistor; 815: transistor; 1011 to 1014: memory element; 1021 to 1024: memory element; 1031 to 1034: memory element; 1041 to 1044: memory element; 1101 to 1104: word line; 1201 to 1204: bit line; 1300: wiring; 1501 to 1504: transistor; 2001 to 2004: transistor; 2011 to 2014: comparator; 2021 to 2024: comparator; 2031 to 2034: comparator; 2201: main body; 2202: housing; 2203: display portion; 2204: keyboard; 2211: main body; 2212: stylus; 2213: display portion; 2214: operation button; 2215: external interface; 2220: e-book reader; 2221: housing; 2223: housing; 2225: display portion; 2227: display portion; 2231: power button; 2233: operation key; 2235: speaker; 2237: axis portion; 2240: housing; 2241: housing; 2242: display panel; 2243: speaker; 2244: microphone; 2245: operation key; 2246: pointing device; 2247: camera lens; 2248: external connection terminal; 2249: solar cell; 2250: external memory slot; 2261: main body; 2263: eyepiece; 2264: operation switch; 2265: display portion(B); 2266: battery; 2267: display portion(A); 2270: television set; 2271: housing; 2273: display portion; 2275: stand; 2277: display portion; 2279: operation key; 2280: remote controller This application is based on Japanese Patent Application serial no. 2010-235159 filed with Japan Patent Office on Oct. 20, 2010 and Japanese Patent Application serial no. 2011-113231 filed with Japan Patent Office on May 20, 2011, the entire contents of which are hereby incorporated by reference.

The invention claimed is:

1. A method for driving a semiconductor device comprising
a word line, a bit line and a memory cell comprising a transistor and a capacitor,
wherein a gate of the transistor is electrically connected to the word line,
wherein one of a source and a drain of the transistor is electrically connected to the bit line, and
wherein the other of the source and the drain of the transistor is electrically connected to a first electrode of the capacitor, the method comprising the steps of:
turning on the transistor by changing a potential of the word line from a first potential to a second potential and then keeping the transistor on in a first period;
changing a potential of the bit line from a third potential to a fourth potential and then keeping the potential of the bit line to the fourth potential in a second period; and
writing data to the memory cell by changing a third period in which the first period and the second period overlaps so that the memory cell stores multilevel data.

2. The method according to claim 1, wherein a second electrode of the capacitor is electrically connected to a wiring supplying a fixed potential.

3. The method according to claim 1, wherein a channel region of the transistor comprises an oxide semiconductor.

4. The method according to claim 1,
wherein the semiconductor device further comprises a driver circuit for driving the memory cell, and
wherein the driver circuit comprises a transistor whose channel region comprising polycrystalline silicon or single crystal silicon.

5. A method for driving a semiconductor device comprising a word line, a bit line and a memory cell comprising a transistor and a capacitor,
wherein a gate of the transistor is electrically connected to the word line,
wherein one of a source and a drain of the transistor is electrically connected to the bit line, and
wherein the other of the source and the drain of the transistor is electrically connected to a first electrode of the capacitor, the method comprising the steps of:
turning on the transistor by changing a potential of the word line from a first potential to a second potential and then keeping the transistor on in a first period;
changing a potential of the bit line from a third potential to a fourth potential and then keeping the potential of the bit line to the fourth potential in a second period; and
writing data to the memory cell by changing a third period in which the first period and the second period overlaps so that a potential of the first electrode of the capacitor is held at a fifth potential between the third potential and the fourth potential and the memory cell stores multilevel data.

6. The method according to claim 5, wherein a second electrode of the capacitor is electrically connected to a wiring supplying a fixed potential.

7. The method according to claim 5, wherein a channel region of the transistor comprises an oxide semiconductor.

8. The method according to claim 5,
wherein the semiconductor device further comprises a driver circuit for driving the memory cell, and
wherein the driver circuit comprises a transistor whose channel region comprising polycrystalline silicon or single crystal silicon.

9. A method for driving a semiconductor device comprising a word line, a bit line and a memory cell comprising a transistor and a capacitor,
wherein a gate of the transistor is electrically connected to the word line,
wherein one of a source and a drain of the transistor is electrically connected to the bit line, and
wherein the other of the source and the drain of the transistor is electrically connected to a first electrode of the capacitor, the method comprising the steps of:
turning on the transistor by changing a potential of the word line from a first potential to a second potential and then keeping the transistor on in a first period;
changing a potential of the bit line from a third potential to a fourth potential and then keeping the potential of the bit line to the fourth potential in a second period; and
writing data to the memory cell by changing a third period in which the first period and the second period overlaps so that the amount of charge accumulated in the capacitor is controlled and the memory cell stores multilevel data.

10. The method according to claim 9, wherein a second electrode of the capacitor is electrically connected to a wiring supplying a fixed potential.

11. The method according to claim 9, wherein a channel region of the transistor comprises an oxide semiconductor.

12. The method according to claim 9,
wherein the semiconductor device further comprises a driver circuit for driving the memory cell, and
wherein the driver circuit comprises a transistor whose channel region comprising polycrystalline silicon or single crystal silicon.

* * * * *

UNITED STATES PATENT AND TRADEMARK OFFICE
CERTIFICATE OF CORRECTION

| | | |
|---|---|---|
| PATENT NO. | : 8,976,571 B2 | Page 1 of 1 |
| APPLICATION NO. | : 13/274649 | |
| DATED | : March 10, 2015 | |
| INVENTOR(S) | : Koichiro Kamata | |

It is certified that error appears in the above-identified patent and that said Letters Patent is hereby corrected as shown below:

In the Specification

Column 7, line 4, replace "In-Sn-Gf-Zn-based" with --In-Sn-Hf-Zn-based--;

Column 7, line 10, replace "In-Gf-Zn-based" with --In-Hf-Zn-based--;

Column 10, line 37, after "tetracoordinate" replace "o" with --0--;

Column 11, line 46, replace "In-Gf-Zn-based" with --In-Hf-Zn-based--;

Column 13, line 18, after "channel" insert --.--;

Column 15, line 61, after "15" replace "mm" with --nm--;

Column 15, line 67, after "mobility" insert --μ--;

Column 21, line 9, replace "cm$^2$Nsec" with --cm$^2$/Vsec--;

Column 24, line 67, after "where" replace "LIW" with --L/W--;

Column 25, line 59, after "film" replace "506" with --606--;

Column 25, line 61, after "film" replace "506" with --606--;

Column 25, line 62, after "film" replace "506" with --606--;

Column 25, line 64, after "film" replace "506" with --606--;

Column 25, line 66, after "film" replace "516" with --616--;

Column 26, line 2, after "film" replace "516" with --616--;

Column 26, line 2, after "film" replace "520" with --620--;

Column 26, line 3, after "film" replace "516" with --616--;

Column 26, line 6, after "film" replace "506" with --606--;

Column 26, line 11, after "film" replace "516" with --616--;

Column 26, line 15, after "film" replace "520" with --620--; and

Column 26, line 21, after "film" replace "506" with --606--.

Signed and Sealed this
Tenth Day of November, 2015

Michelle K. Lee
*Director of the United States Patent and Trademark Office*